(12) United States Patent
Kim et al.

(10) Patent No.: US 12,740,248 B2
(45) Date of Patent: Sep. 15, 2026

(54) ELECTRONIC PANEL AND ELECTRONIC APPARATUS INCLUDING THE SAME

(71) Applicant: SAMSUNG DISPLAY CO., LTD., Yongin-si (KR)

(72) Inventors: Hyangyul Kim, Hwaseong-si (KR); Sunhwa Kim, Hwaseong-si (KR); Heeseong Jeong, Suwon-si (KR); Suk Hoon Ku, Seoul (KR); Hyun-Gue Song, Hwaseong-si (KR); Dukjin Lee, Suwon-si (KR); Sang Min Yi, Suwon-si (KR)

(73) Assignee: Samsung Display Co., Ltd., Yongin-si (KR)

(*) Notice: Subject to any disclaimer, the term of this patent is extended or adjusted under 35 U.S.C. 154(b) by 108 days.

(21) Appl. No.: 18/449,697

(22) Filed: Aug. 14, 2023

(65) Prior Publication Data

US 2023/0397455 A1 Dec. 7, 2023

Related U.S. Application Data

(62) Division of application No. 16/797,419, filed on Feb. 21, 2020, now Pat. No. 11,730,014.

(30) Foreign Application Priority Data

Mar. 12, 2019 (KR) ........................ 10-2019-0028410

(51) Int. Cl.
*H10K 59/122* (2023.01)
*H10K 59/80* (2023.01)
(Continued)

(52) U.S. Cl.
CPC ....... *H10K 59/122* (2023.02); *H10K 59/8723* (2023.02); *H10K 59/121* (2023.02);
(Continued)

(58) Field of Classification Search
None
See application file for complete search history.

(56) References Cited

U.S. PATENT DOCUMENTS 7,086,764 B2 8/2006 Vitale et al.
8,047,598 B2 11/2011 Takeda
(Continued)

FOREIGN PATENT DOCUMENTS

CN 105794322 A 7/2016
CN 108598136 A 9/2018
(Continued)

OTHER PUBLICATIONS

An OLED Display Panel And Display Device (Year: 2019).*
European Office Action corresponding to EP Application No. 20161434.4, dated Jun. 3, 2025, 7 pages.

*Primary Examiner* — Nilufa Rahim
(74) *Attorney, Agent, or Firm* — Womble Bond Dickinson (US) LLP

(57) ABSTRACT

An electronic panel, includes: a base substrate including a front surface, a rear surface opposite the front surface, and a plurality of side surfaces connecting the front surface and the rear surface to each other; a pixel definition layer on the front surface of the base substrate and having a plurality of openings defined therein; a plurality of emitting elements in the openings; and a spacer on the pixel definition layer and spaced apart from the openings, wherein a thickness of the spacer is equal to or greater than a thickness of the pixel definition layer.

10 Claims, 29 Drawing Sheets

(51) Int. Cl.
*H10K 59/121* (2023.01)
*H10K 59/131* (2023.01)
*H10K 102/00* (2023.01)

(52) U.S. Cl.
CPC ....... *H10K 59/131* (2023.02); *H10K 59/8791* (2023.02); *H10K 2102/351* (2023.02)

(56) References Cited

U.S. PATENT DOCUMENTS 8,067,888 B2 11/2011 Wu
8,198,808 B2 6/2012 Chan et al.
8,668,372 B2 3/2014 Duerksen et al.
8,835,205 B2 9/2014 Park
9,093,382 B2 7/2015 Liu et al.
9,256,794 B2 2/2016 Braithwaite et al.
9,704,926 B2 7/2017 Kim
9,869,445 B2 1/2018 Baccarin et al.
9,936,562 B2 4/2018 Jin et al.
10,228,582 B2 3/2019 Huh et al.
10,312,299 B2 6/2019 Jun et al.
10,541,294 B2 1/2020 Hong et al.
11,604,373 B2 3/2023 Lin et al.
2008/0179613 A1 7/2008 Wendt et al.
2013/0049003 A1* 2/2013 Choi .................... H10K 59/131 257/E27.119
2013/0094088 A1 4/2013 Merrill
2013/0106294 A1 5/2013 Rakuff et al.
2014/0132897 A1 5/2014 Oya et al.
2014/0225839 A1* 8/2014 Dunphy ................ G06F 3/0412 345/173
2014/0326295 A1 11/2014 Moslehi
2015/0162391 A1 6/2015 Kim
2015/0200237 A1 7/2015 Yim et al.
2016/0116668 A1 4/2016 Hikmet et al.
2016/0218157 A1 7/2016 Ahn
2016/0225834 A1 8/2016 Kim et al.
2016/0300894 A1 10/2016 Park
2016/0304025 A1 10/2016 King
2016/0311363 A1 10/2016 Ferigo et al.
2016/0322433 A1 11/2016 Kim et al.
2016/0372528 A1 12/2016 Kamura et al.
2017/0186836 A1 6/2017 Tada et al.
2017/0250240 A1* 8/2017 Lee ...................... H10D 86/441
2017/0256597 A1 9/2017 Lee et al.
2017/0287988 A1* 10/2017 Lee ........................ H10K 50/19
2017/0364726 A1 12/2017 Buchan et al.
2018/0294327 A1* 10/2018 Chen .................... H10K 59/131
2018/0342564 A1* 11/2018 Hanari ................. H10K 59/124
2019/0372052 A1* 12/2019 Kishimoto ......... H10K 59/1213
2019/0393283 A1 12/2019 Lu et al.
2020/0335719 A1 10/2020 Xu et al.
2021/0056902 A1* 2/2021 Tanaka ................. G09G 3/3291
2021/0351263 A1* 11/2021 Okabe ................ H10K 59/8731
2022/0285654 A1 9/2022 Chai et al.

FOREIGN PATENT DOCUMENTS

CN 108933155 A 12/2018
CN 208622729 U * 3/2019 ......... H01L 27/3246
EP 3125331 A1 2/2017
EP 3276462 A1 1/2018
KR 2011-0094460 A 8/2011
KR 10-2015-0067624 A 6/2015
KR 2015-0084573 A 7/2015
KR 10-2015-0099629 A 9/2015
KR 2015-0100995 A 9/2015
KR 10-2017-0026721 A 3/2017
KR 10-2017-0112304 A 10/2017
KR 10-1792236 B1 10/2017
KR 2018-0014397 A 2/2018

* cited by examiner

NEA
EA_B
NEA
EA_B
NEA
EA_R
NEA
30
20
10
BS
I'
I
SLb
TT
SLa
T2
T1
SP_S
SP
PDL_S
PDL
E2
EP
E1
EE
OE
CE
AP
IE
TR
OP

ELECTRONIC PANEL AND ELECTRONIC APPARATUS INCLUDING THE SAME

CROSS-REFERENCE TO RELATED APPLICATIONS

This application is a divisional of U.S. patent application Ser. No. 16/797,419, filed Feb. 21, 2020, which claims priority to and the benefit of Korean Patent Application No. 10-2019-0028410, filed Mar. 12, 2019, the entire content of both of which is incorporated herein by reference.

BACKGROUND

Aspects of some example embodiments of the present inventive concept relate to an electronic panel and an electronic apparatus including the same, and for example, to an electronic panel with improved visibility and an electronic apparatus including the same.

An electronic apparatus is activated by electrical signals. The electronic apparatus may include various electronic parts such as an electronic panel and an electronic module. The electronic panel includes a plurality of light-emitting devices configured to produce or display images. The light-emitting devices define corresponding emission areas, and an image may be generated by light displayed at the emission areas.

A display surface may display an image and at the same time may be exposed to external light. The external light may travel through the display surface into the electronic panel. The light incident into the electronic panel may be reflected from various components constituting the electronic panel.

The above information disclosed in this Background section is only for enhancement of understanding of the background and therefore the information discussed in this Background section does not necessarily constitute prior art.

SUMMARY

Some example embodiments of the present inventive concept include an electronic panel configured to preventing a reduction in visibility or display quality that may otherwise be caused by internal light leakages and an electronic apparatus including the electronic panel.

According to some example embodiments of the present inventive concept, an electronic panel includes: a base substrate including a front surface, a rear surface opposed to the front surface, and a plurality of side surfaces connecting the front surface and the rear surface to each other; a pixel definition layer on the front surface of the base substrate and having a plurality of openings defined therein; a plurality of emitting elements in the openings; and a spacer on the pixel definition layer and spaced apart from the openings. A thickness of the spacer may be equal to or greater than a thickness of the pixel definition layer.

According to some example embodiments, the pixel definition layer and the spacer may have a unitary shape.

According to some example embodiments, a ratio of the thickness of the pixel definition layer to a sum of the thicknesses of the pixel definition layer and the spacer may be equal to or less than 0.3.

According to some example embodiments, each of the openings may include: a first side extending along a direction inclined at a first angle relative to an extending direction of a first side surface among the side surfaces, when viewed from the front surface; and a second side connected to the first side and extending along a direction inclined at a second angle relative to the extending direction of the first side surface. One or more of the first angle and the second angle may be in a range of 45°±15° or 135°±15°.

According to some example embodiments, the spacer may include: a first sidewall extending along a direction inclined at a first angle relative to an extending direction of a first side surface among the side surfaces, when viewed from the front surface; and a second sidewall connected to the first sidewall and extending along a direction inclined at a second angle relative to the extending direction of the first side surface. One or more of the first angle and the second angle may be in a range of 45°±15° or 135°±15°.

According to some example embodiments, the spacer may further include a third sidewall extending in a direction perpendicular to the extending direction of the first side surface and having connection either with the first sidewall or with the second sidewall, when viewed from the front surface.

According to some example embodiments, the electronic panel may further comprise a plurality of signal lines between the base substrate and the pixel definition layer. The signal lines may be electrically connected to the emitting elements. When viewed from the front surface, an angle between an extending direction of a first side surface among the side surfaces and an extending direction of each of the signal lines may be in a rage of 45°±15° or 135°±15°.

According to some example embodiments, when viewed in plan, the signal lines may overlap the pixel definition layer.

According to some example embodiments, the electronic panel may further comprise a plurality of mesh lines that lie on the pixel definition layer and have a plurality of mesh openings defined therein. The mesh openings may correspond to the openings of the pixel definition layer. The mesh lines may include: a first mesh line extending along a single direction; and a second mesh line extending along a direction intersecting the single direction. When viewed from the front surface, an angle between an extending direction of a first side surface among the side surfaces and each of the single direction and the intersecting direction may be in a rage of 45°±15° or 135°±15°.

According to some example embodiments of the present inventive concept, an electronic apparatus includes: an electronic panel including a plurality of emission regions; and a housing unit accommodating the electronic panel. The electronic panel may include: a base substrate including a front surface, a rear surface opposed to the front surface, and first to fourth side surfaces connecting the front surface and the rear surface to each other; a pixel definition layer on the front surface and having a plurality of openings defined therein, the openings corresponding to the emission regions and including a first side and a second side connected to each other; a plurality of emitting elements in the openings; a plurality of thin film transistors between the base substrate and the pixel definition layer, the thin film transistors being connected to corresponding emitting elements; and a plurality of signal lines between the pixel definition layer and the base substrate, the signal lines being connected to corresponding thin film transistors. The first side, the second side, and one or more of the signal lines may extend at an inclined angle relative to the first side surface, when viewed from the front surface. A smallest value of the inclined angle may be in a range of 45°±15°.

According to some example embodiments, each of the emitting elements may include: a first electrode; a second electrode on the first electrode and covering the pixel definition layer; and an emitting pattern between the first electrode and the second electrode. The first side and the second side may be portions of the pixel definition layer that are in contact with the first electrode.

According to some example embodiments, the electronic apparatus may further comprise a spacer on the pixel definition layer and spaced apart from the openings.

According to some example embodiments, the spacer may be covered with the second electrode.

According to some example embodiments, a thickness of the spacer may be equal to or greater than a thickness of the pixel definition layer on an area where the spacer is located.

According to some example embodiments, the spacer and the pixel definition layer may have a unitary shape.

According to some example embodiments, a ratio of the thickness of the pixel definition layer to a sum of the thicknesses of the pixel definition layer and the spacer may be equal to or less than 0.3.

According to some example embodiments, when viewed from the front surface, the spacer may include: a first sidewall having a first inclined angle relative to the first side surface; and a second sidewall having a second inclined angle relative to the first side surface. The second sidewall may be connected to the first sidewall. Each of the first inclined angle and the second inclined angle may have a range of 45°±15°.

According to some example embodiments, the first sidewall and the second sidewall of the spacer may be adjacent to the first side surface.

According to some example embodiments, the electronic apparatus may further comprise a plurality of mesh lines that lie on the pixel definition layer and have a plurality of mesh openings defined therein. The mesh openings may correspond to the emission regions. When viewed from the front surface, an extending direction of each of the mesh lines may be inclined at a certain angle relative to the first side surface. A smallest value of the certain angle may be in a range of 45°±15°.

According to some example embodiments, the housing unit may be an automotive vehicle.

DETAILED DESCRIPTION

The following will now describe aspects of some example embodiments of the present inventive concept in conjunction with the accompanying drawings.

Figure 1:
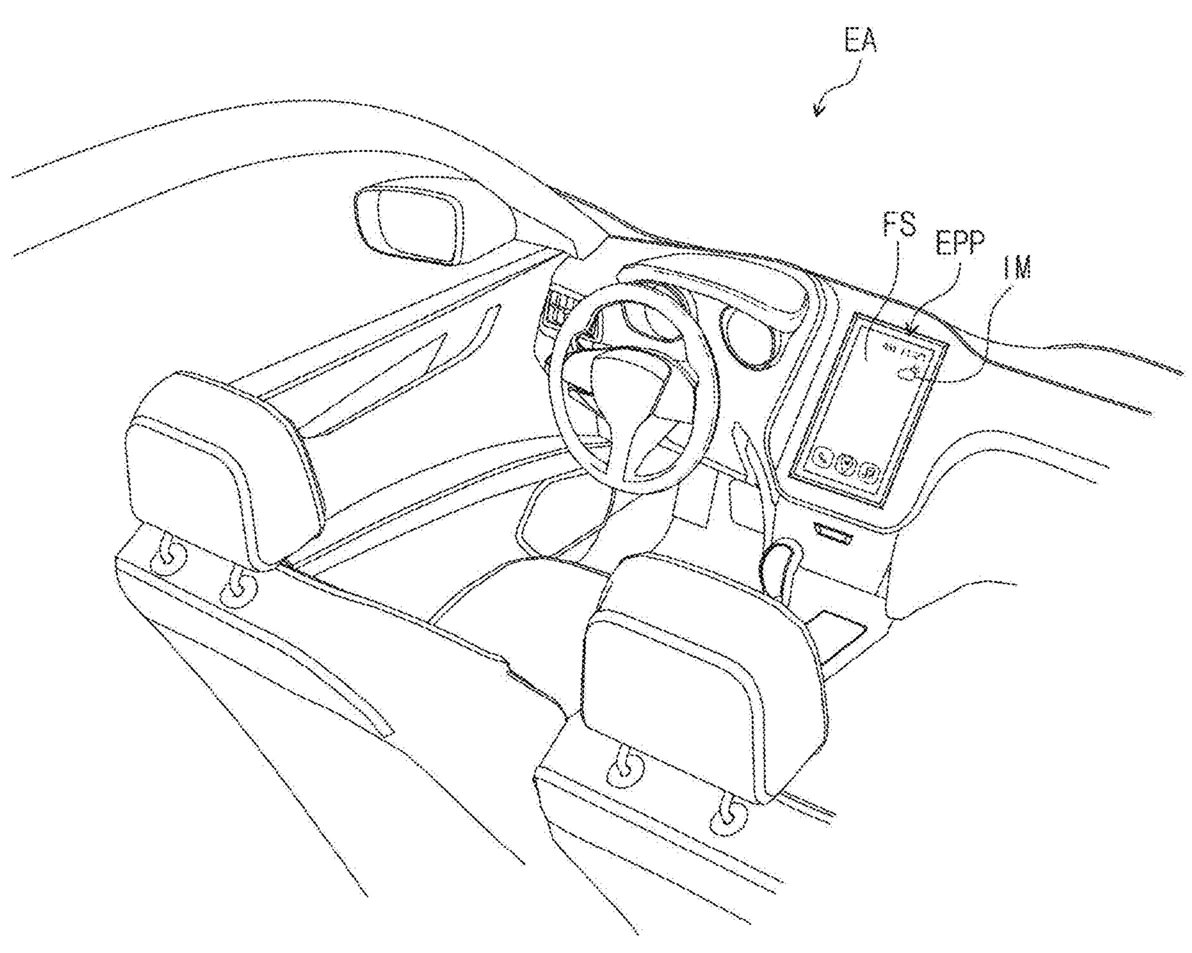
FIG. 1 illustrates a perspective view showing a portion of an electronic apparatus according to some example embodiments of the present inventive concept.
Figure 2:
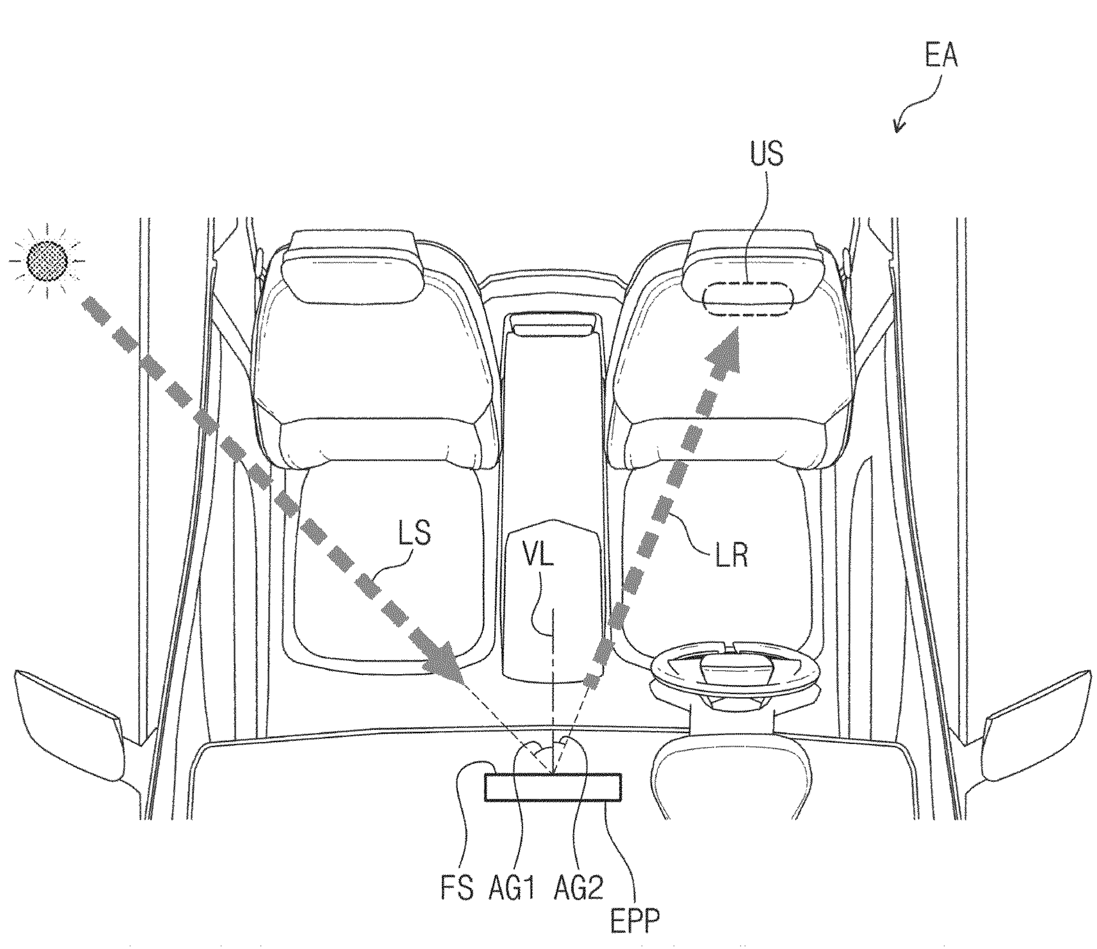
FIG. 2 illustrates a perspective view showing another portion of the electronic apparatus depicted in FIG. 1.

FIG. 1 illustrates a perspective view showing a portion of an electronic apparatus according to some example embodiments of the present inventive concept. FIG. 2 illustrates a perspective view showing another portion of the electronic apparatus depicted in FIG. 1. Hereinafter, aspects of some example embodiments of the present inventive concept will be described with reference to FIGS. 1 and 2.

Referring to FIG. 1, an electronic apparatus EA includes an electronic panel EPP. In correspondence to electrical signals, the electronic panel EPP displays an image IM on a display surface FS. The image IM may include a static image or a dynamic image.

According to some example embodiments, the electronic apparatus EA contains the electronic panel EPP. The electronic apparatus EA may accommodate the electronic panel EPP on an appropriate position to allow users to easily recognize an image displayed on the electronic panel EPP. According to some example embodiments, an automotive vehicle is illustrated as an example to indicate the electronic apparatus EA The electronic panel EPP may be received within the automotive vehicle and located below a front window.

Referring to FIG. 2, a portion of external light may be incident through a side window into the automotive vehicle. When the external light is directed toward the electronic panel EPP, a first light LS may be incident at a first angle AG1 relative to the display surface FS and then may exit as a second light LR reflected at a second angle AG2 from the display surface FS, which second light LR may travel toward eyes of a user US, in particular a driver. The second light LR may produce glare to eyes of the user US, and thus user's visibility on the image IM may be reduced.

According to some example embodiments, the first angle AG1 may be 45° relative to a reference line VL, and the second angle AG2 may be 30° relative to the reference line VL. The closer the angle of light approaches 30° relative to the display surface FS, the more likely the user US feels glare. When light is directed at an inclined angle close to 45° relative to the display surface FS, there is a high likelihood that the light is reflected at an angle close to 30°. As a result, the electronic apparatus EA according to some example embodiments of the present inventive concept may reduce distribution of the second light LR among lights exiting from the electronic panel EPP, or to reduce a quantity of light exiting at an angle close to 30°, which may result in prevention of user's glare and improvement in visibility of the image IM.

Figure 3:
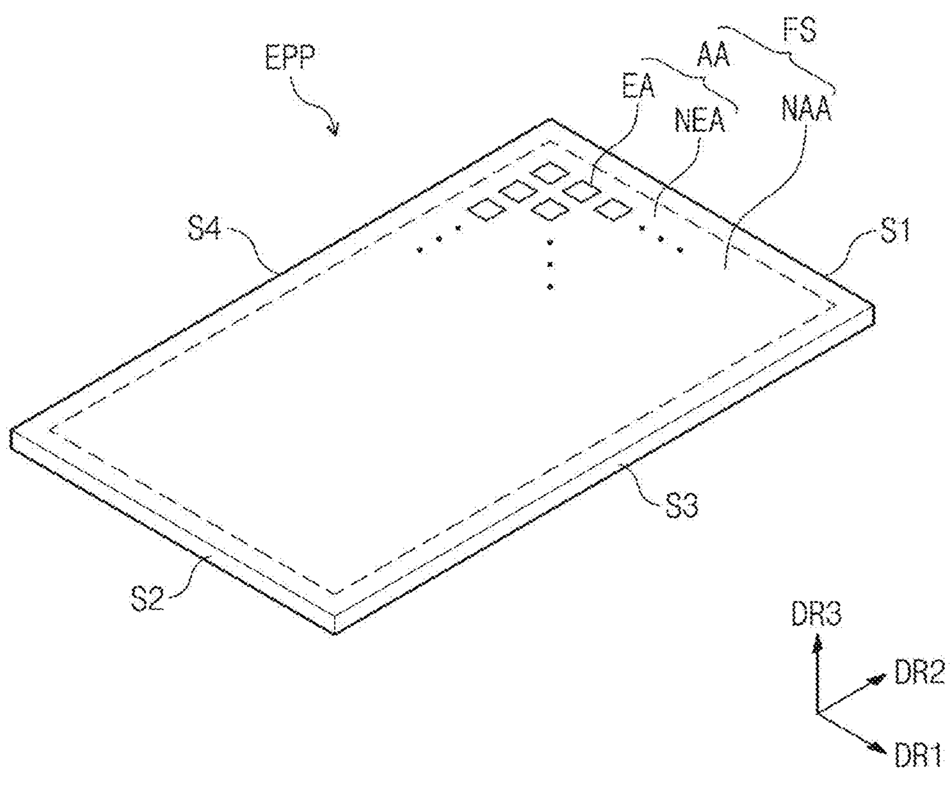
FIG. 3 illustrates a perspective view showing an electronic panel according to some example embodiments of the present inventive concept.
Figure 4A:
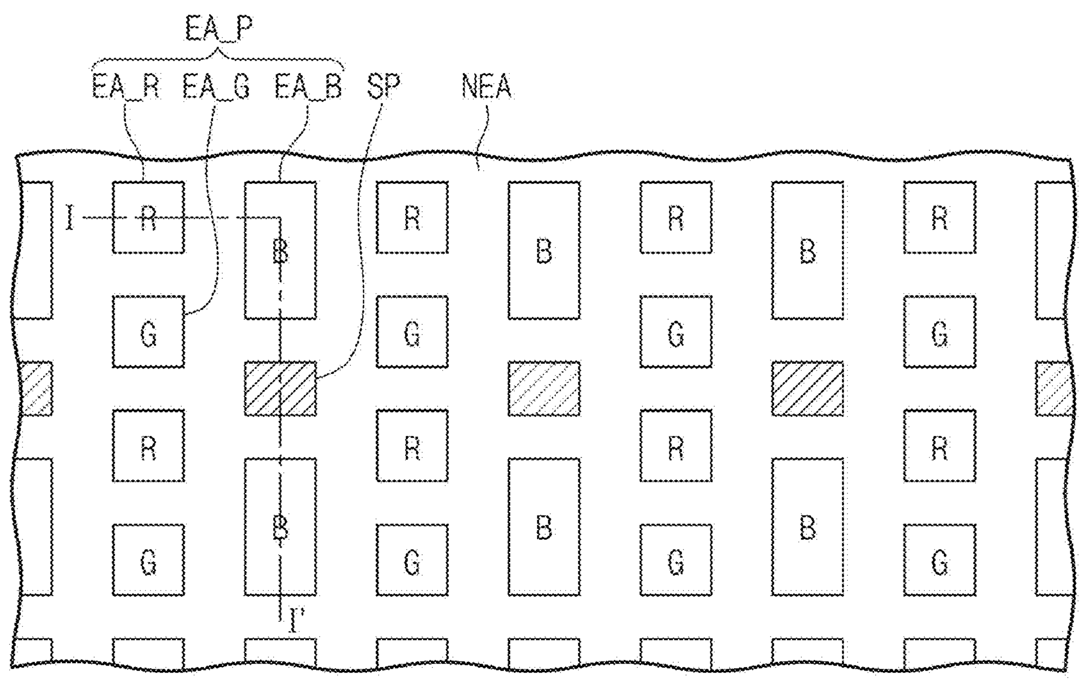
FIG. 4A illustrates a plan view showing a portion of FIG. 3.
Figure 4B:
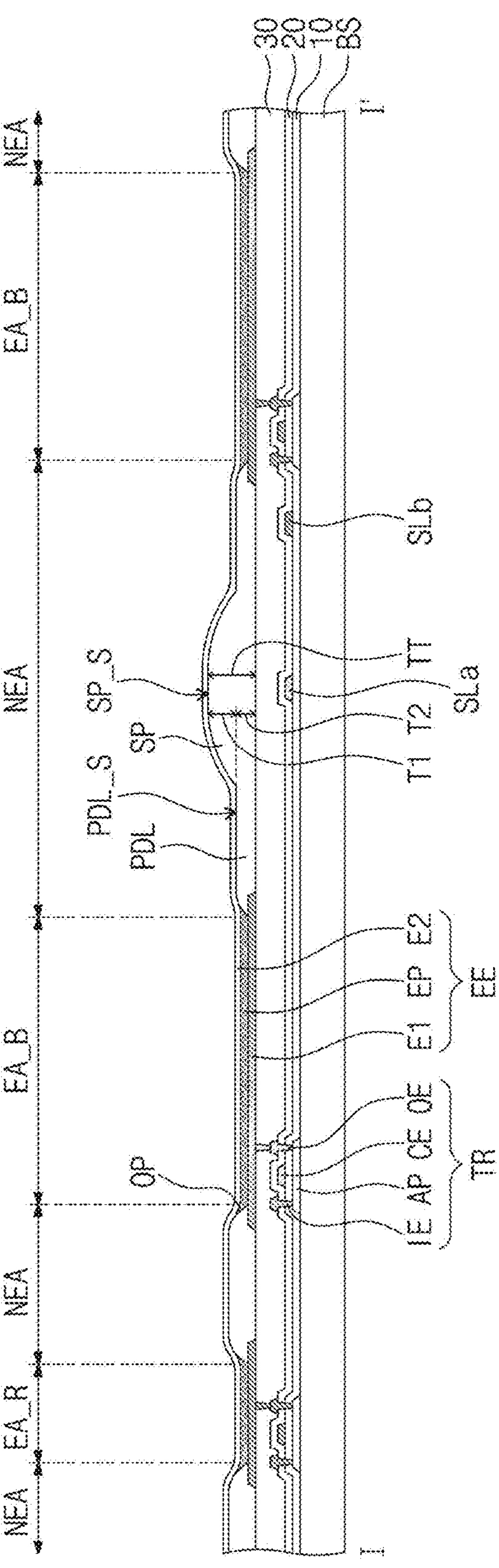
FIG. 4B illustrates a cross-sectional view taken along the line I-I' of FIG. 4A.

FIG. 3 illustrates a perspective view showing an electronic panel according to some example embodiments of the present inventive concept. FIG. 4A illustrates a plan view showing a portion of FIG. 3. FIG. 4B illustrates a cross-sectional view taken along the line I-I' of FIG. 4A. Hereinafter, aspects of some example embodiments of the present inventive concept will be described with reference to FIGS. 3, 4A, and 4B.

As shown in FIG. 3, an electronic panel EPP is illustrated to have a hexahedral plate shape including a display surface FS, a rear surface, and a plurality of side surfaces S1, S2, S3, and S4. The display surface FS may be divided into an active area AA and a peripheral area NAA on a plane defined by a first direction DR1 and a second direction DR2. The display surface FS displays an image toward a third direction DR3.

The side surfaces S1, S2, S3, and S4 may include a first side surface S1, a second side surface S2, a third side surface S3, and a fourth side surface S4. The first, second, third, and fourth side surfaces S1, S2, S3, and S4 connect the display surface FS and the rear surface to each other.

The first side surface S1 and the second side surface S2 may extend along the first direction DR1, and may be parallel to and opposed to each other in the second direction DR2. The third side surface S3 and the fourth side surface S4 may extend along the second direction DR2, and may be parallel to and opposed to each other in the first direction DR1.

According to some example embodiments, on the plane, external light (see LS of FIG. 2) may be incident in a direction perpendicular to one or more of the first, second, third, and fourth side surfaces S1, S2, S3, and S4.

One the plane, the display surface FS may receive the external light LS traveling along a direction perpendicular to one or more of the first, second, third, and fourth side surfaces S1, S2, S3, and S4. According to some example embodiments, the external light LS is illustrated to travel in a direction perpendicular to the third side surface S3 or the fourth side surface S4.

The active area AA may include a plurality of emission areas EA and a non-emission area NEA. The emission areas EA may be located spaced apart from each other. Each of the emission areas EA displays light. The emission areas EA may be driven independently of each other.

FIG. 4A discloses a unit emission area EA_P. The unit emission area EA_P may include a first emission region EA_R, a second emission region EA_G, and a third emission region EA_B. The first, second, and third emission regions EA_R, EA_G, and EA_B emit lights having different colors from each other. According to some example embodiments, it is illustrated, as an example, that the first emission region EA_R emits a red-colored light, the second emission region EA_G emits a green-colored light, and the third emission region EA_B emits a blue-colored light, but embodiments according to the present inventive concept are not limited thereto.

The non-emission area NEA is adjacent to the emission areas EA. The non-emission area NEA may have a grid shape on the plane. The non-emission area NEA defines spaces between the emission areas EA.

The electronic panel EPP may include a base substrate BS, a thin film transistor TR, an emitting element EE, a plurality of dielectric layers 10, 20, and 30, a plurality of signal lines SLa and SLb, a pixel definition layer PDL, and a spacer SP. The dielectric layers 10, 20, and 30 are illustrated, as an example, to include a first dielectric layer 10, a second dielectric layer 20, and a third dielectric layer 30.

The base substrate BS may be a dielectric substrate. For example, the base substrate BS may include a plastic substrate or a glass substrate.

The thin film transistor TR is located on the base substrate BS. The thin film transistor TR includes a semiconductor pattern AP, a control electrode CE, an input electrode IE, and an output electrode OE.

The semiconductor pattern AP is positioned between the base substrate BS and the first dielectric layer 10. The semiconductor pattern AP may include a semiconductor material. The control electrode CE is spaced apart from the semiconductor pattern AP across the first dielectric layer 10.

The input electrode IE and the output electrode OE are positioned on the second dielectric layer 20, and spaced apart from each other on the plane. The input electrode IE and the output electrode OE penetrate the first dielectric layer 10 and the second dielectric layer 20, and are respectively coupled to one side and other side of the semiconductor pattern AP.

The third dielectric layer 30 is positioned on the second dielectric layer 20, covering the input electrode IE and the output electrode OE. For another example, for the thin film transistor TR, the semiconductor pattern AP may be positioned on the control electrode CE. For another example, the semiconductor pattern AP may be positioned on the input electrode IE and the output electrode OE. For another example, the input electrode IE and the output electrode OE may be positioned on the same layer on which the semiconductor pattern AP is positioned, and thus may be directly coupled to the semiconductor pattern AP. The thin film transistor TR according to some example embodiments of the present inventive concept may be formed to have various structures, and the configuration of the thin film transistor TR is not limited to a certain embodiment.

The signal lines SLa and SLb may be positioned between the base substrate BS and the pixel definition layer PDL. The signal lines SLa and SLb may include a conductive material. For example, the signal lines SLa and SLb may include the same material as that of the control electrode CE, the input electrode IE, or the output electrode OE.

The signal lines SLa and SLb may be connected to and may provide electrical signals to the thin film transistor TR or the emitting element EE. The signal lines SLa and SLb may include a gate line, a data line, a power line, or any other lines that transfer electrical signals to the thin film transistor TR or the emitting element EE.

According to some example embodiments, the signal lines SLa and SLb are illustrated, as an example, to include two signal lines, or a first signal line SLa and a second signal line SLb, that are positioned between the first dielectric layer 10 and the second dielectric layer 20. The first and second signal lines SLa and SLb may be spaced apart from each other on the same layer. The first and second signal lines SLa and SLb may transfer independent electrical signals of each other.

However, the configuration discussed above is merely illustrative, and when the first and second signal lines SLa and SLb are possible to provide electrical signals to the thin film transistor TR or the emitting element EE, the first and second signal lines SLa and SLb may be, but not limited to a certain embodiment, positioned on various or different locations.

The emitting element EE may either produce light in accordance with electrical signals or control a quantity of light. For example, the emitting element EE may include an organic light-emitting device, a quantum dot light-emitting device, an electrophoresis device, or an electro-wetting device.

The emitting element EE may include a first electrode E1, a second electrode E2, and an emitting pattern EP. For the emitting element EE, a difference in potential between the first electrode E1 and the second electrode E2 is used to excite the emitting pattern EP to produce light. Therefore, each of the emission areas EA may emit light.

The first electrode E1 may penetrate the third dielectric layer 30, and may be coupled to the thin film transistor TR. According to some example embodiments, the electronic panel EPP may further include an interconnection electrode between the first electrode E1 and the thin film transistor TR, and in this case, the first electrode E1 may be electrically coupled through the interconnection electrode to the thin film transistor TR.

The emitting pattern EP is positioned between the first electrode E1 and the second electrode E2. The emitting pattern EP may include a light-emitting material. For example, the emitting pattern EP may be formed of one or more of a material emitting a red-colored light, a material emitting a green-colored light, and a material emitting a blue-colored light, and may include a fluorescent or phosphorescent material. The emitting pattern EP may include an inorganic light-emitting material or an organic light-emitting material. The emitting pattern EP may emit light in response to the difference in potential between the first electrode E1 and the second electrode E2.

The second electrode E2 is located on the emitting pattern EP. The second electrode E2 may face the first electrode E1. The second electrode E2 may have any other shapes overlapping a plurality of emission areas EA in the active area AA. The second electrode E2 may be provided in common to a plurality of pixels. The emitting element EE positioned on each pixel receives a common power voltage through the second electrode E2.

The pixel definition layer PDL is positioned on the third dielectric layer 30. The pixel definition layer PDL may include a plurality of openings OP. The openings OP may be formed to penetrate the pixel definition layer PDL. Each of the openings OP exposes at least a portion of the first electrode E1. The openings OP may define corresponding emission areas EA.

The spacer SP is positioned on the pixel definition layer PDL. The spacer SP may be used to support a mask when the emitting pattern EP is formed. Thus, compared to other zones, a zone in which the spacer SP is located may protrude more toward the third direction DR3.

The spacer SP may be provided in plural, and the plurality of spacers SP may be positioned spaced apart from each other on the plane. According to some example embodiments, the spacer SP is located on a zone surrounded by two third emission regions EA_B, two second emission regions EA_G, and two first emission regions EA_R. However, the placement of the spacer SP is merely illustrative, and when the spacer SP is possible to reside between the emission regions EA_R, EA_G, and EA_B, the spacer SP may be, but not limited to a certain embodiment, located on various positions and provided in more numbers.

According to some example embodiments, the spacer SP and the pixel definition layer PDL may be connected to have a unitary shape. The spacer SP and the pixel definition layer PDL may be formed of the same material, and may be formed using one half-tone mask in a single process. Accordingly, it may be possible to omit a separate process for forming the spacer SP. However, the above discussion is merely illustrative, and the spacer SP may be, but not limited to a certain embodiment, formed to have a configuration independently separated from the pixel definition layer PDL.

According to some example embodiments, the spacer SP may be designed to have a thickness T1 (referred to hereinafter as a first thickness) equal to or greater than a thickness T2 (referred to hereinafter as a second thickness) of the pixel definition layer PDL. For example, a ratio of the first thickness T1 to a total thickness TT (T1+T2) of the spacer SP and the pixel definition layer PDL may be equal to or greater than 0.5. In certain embodiments, when the rational portion of the first thickness T1 is controlled, the degree of curve may be easily designed for a top surface SP_S of the spacer SP or a top surface PDL_S of the pixel definition layer PDL. A more detailed description thereof will be further discussed below.

According to some example embodiments, the electronic panel EPP may further include the spacer SP, and therefore the pixel definition layer PDL may be prevented from damages caused by a mask when the emitting pattern EP is formed. In addition, the control of the thicknesses of the spacer SP and the pixel definition layer PDL may easily adjust a reflection angle of external light. Accordingly, the occurrence of reflected light capable of causing glare to user's eyes may be reduced to improve display characteristics of the electronic panel EPP.

Figure 5:
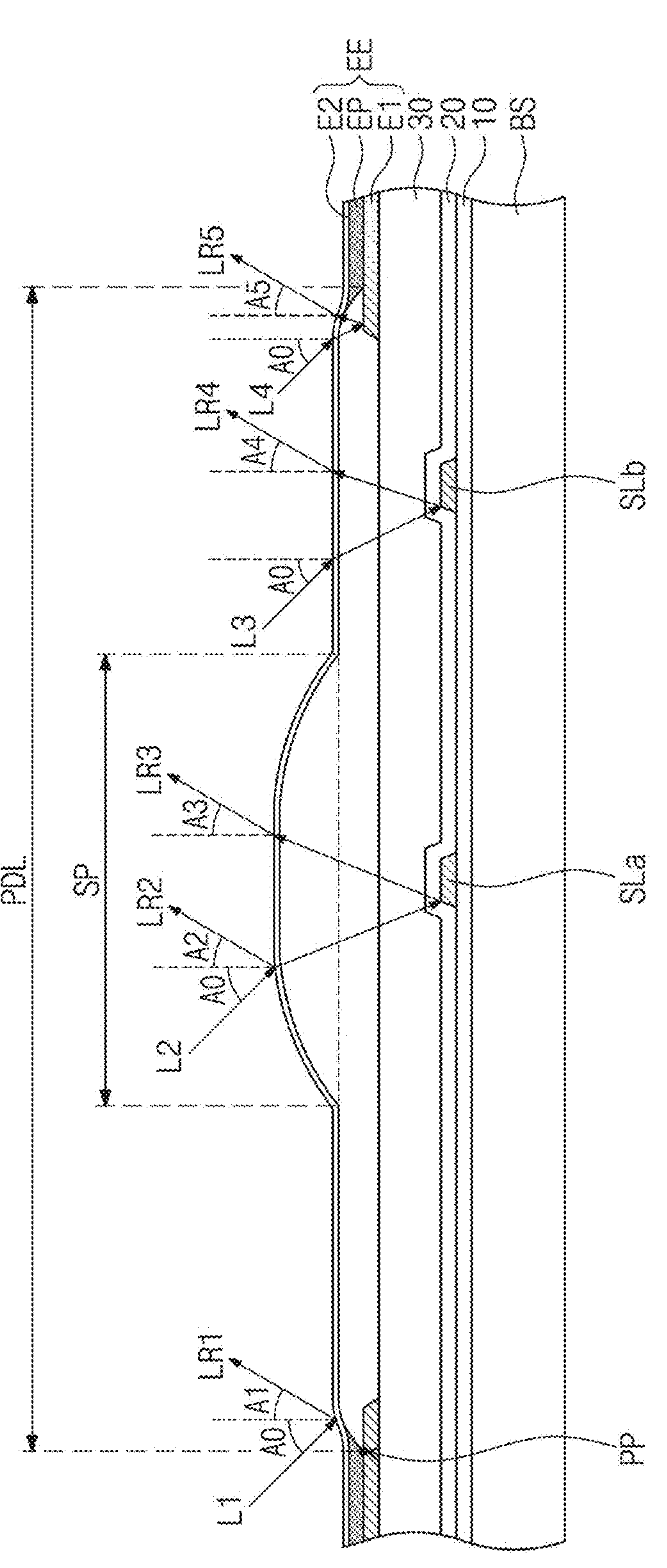
FIG. 5 illustrates a cross-sectional view showing a portion of an electronic panel according to some example embodiments of the present inventive concept.
Figure 6A:
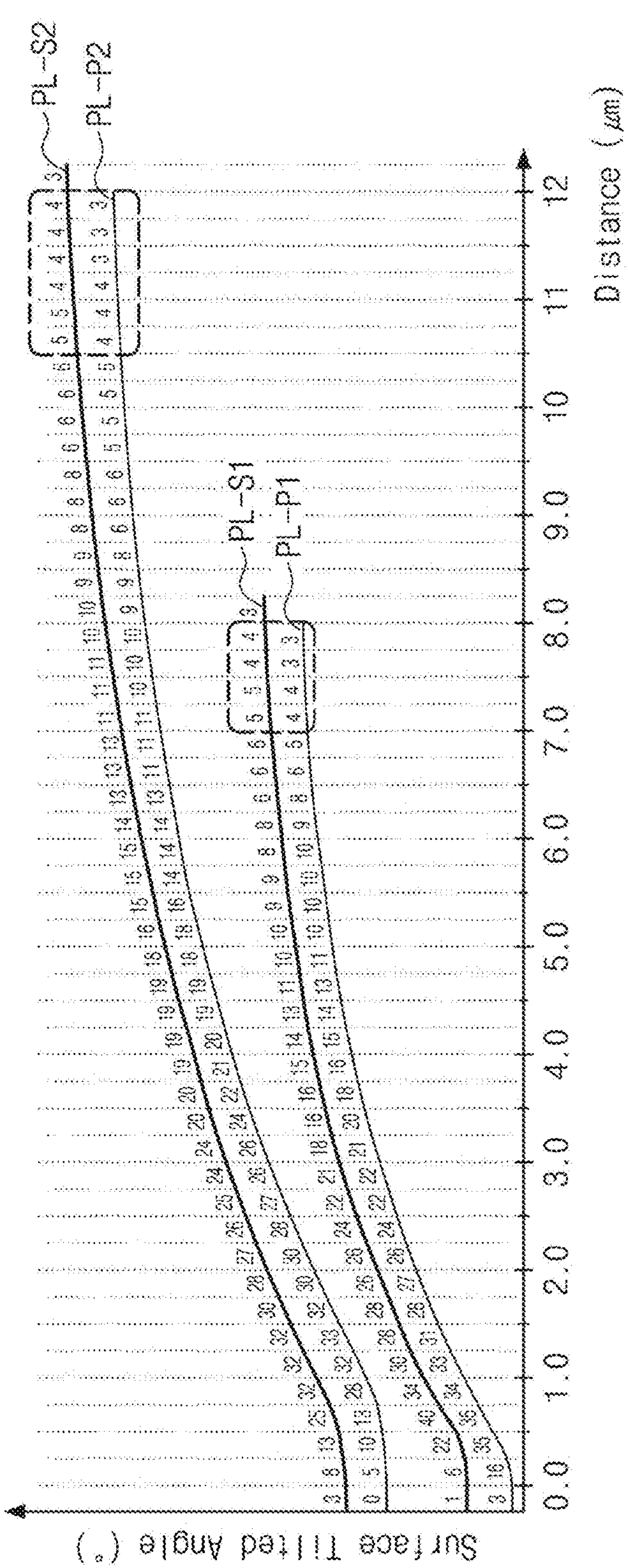
FIG. 6A illustrates a graph showing a surface tilted angle of a pixel definition layer versus distance.
Figure 6B:
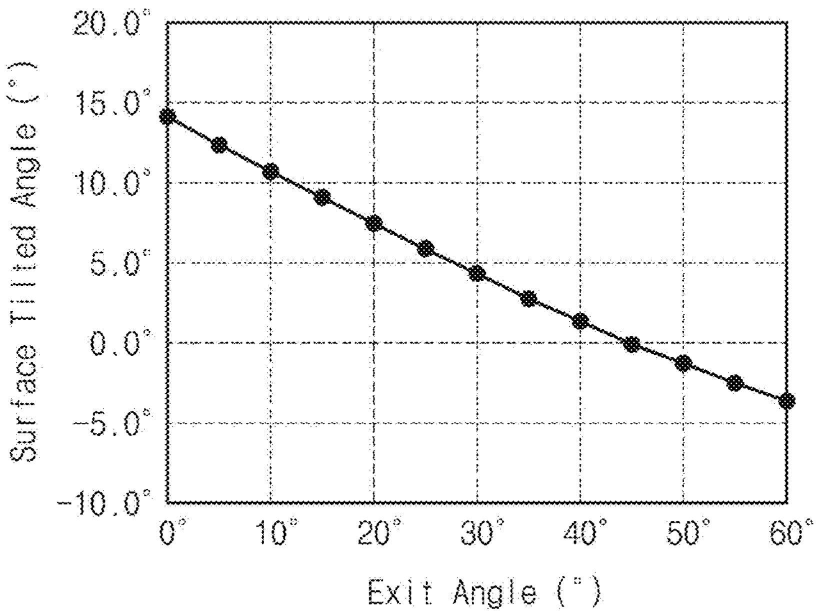
FIG. 6B illustrates a graph showing relationship between exit angles and surface tilted angles.

FIG. 5 illustrates a cross-sectional view showing a portion of an electronic panel according to some example embodiments of the present inventive concept. FIG. 6A illustrates a graph showing a surface tilted angle of a pixel definition layer versus distance. FIG. 6B illustrates a graph showing relationship between exit angles and surface tilted angles. For easiness of description, FIG. 5 illustrates an enlarged view showing a zone in which are located the pixel definition layer PDL and the spacer SP that are selected from components depicted in FIG. 4B, and also illustrates arrows to denote incident lights and reflected lights. The distance shown in FIG. 6 means an interval spaced apart from a point PP illustrated in FIG. 5.

Hereinafter, aspects of some example embodiments of the present inventive concept will be described with reference to FIGS. 5, 6A, and 6B. Those parts substantially the same as those discussed with reference to FIGS. 1 to 3, 4A, and 4B are allocated the same reference numerals thereto, and repetitive explanations thereof will be omitted.

Each of incident lights L1, L2, L3, and L4 may correspond to the external light (see LS of FIG. 2). FIG. 5 illustrates that the incident lights L1, L2, L3, and L4 are incident at the same incidence angle A0. The incident lights L1, L2, L3, and L4 are illustrated, as an example, to include a first incident light L1, a second incident light L2, a third incident light L3, and a fourth incident light L4.

The first incident light L1 may be light incident on the pixel definition layer PDL and the second electrode E2. The first incident light L1 may be incident on a surface of the second electrode E2 covering the pixel definition layer PDL and on a location spaced apart from the spacer SP.

The first incident light L1 may be incident on the second electrode E2 and may produce a first reflected light LR1 reflected from the second electrode E2. The first reflected light LR1 may have an exit angle, or a first angle A1, less than the incidence angle A0.

The second incident light L2 may be light incident on the spacer SP. Based on a reflection location, the second incident light L2 may produce a second reflected light LR2 or a third reflected light LR3. The second reflected light LR2 may be light reflected from the second electrode E2. The second reflected light LR2 may have an exit angle, or a second angle A2.

The third reflected light LR3 may be light reflected from the first signal line SLa. At least a portion of the second incident light L2 may penetrate the second electrode E2, and then sequentially pass through the spacer SP, the pixel definition layer PDL, the third dielectric layer 30, and the second dielectric layer 20, thereby arriving at the first signal line SLa. Light reflected from a side surface of the first signal line SLa may sequentially pass through the second dielectric layer 20, the third dielectric layer 30, the pixel definition layer PDL, and the spacer SP, and then run across the second electrode E2, thereby exiting as the third reflected light LR3. The third reflected light LR3 may have an exit angle, or a third angle A3.

The third incident light L3 may be light that is incident on the pixel definition layer PDL and then produces a fourth reflected light LR4 reflected from the second signal line SLb. The third incident light L3 may penetrate the second electrode E2 after being incident on a location spaced apart from the spacer SP, and then pass through the pixel definition layer PDL, the third dielectric layer 30, and the second dielectric layer 20, thereby arriving at the second signal line SLb. The fourth reflected light LR4 may have an exit angle, or a fourth angle A4.

The fourth incident light L4 may be light that is incident on the pixel definition layer PDL and then produces a fifth reflected light LR5 reflected from the first electrode E1. The fourth incident light L4 is incident on the first electrode E1 after passing through the pixel definition layer PDL. Light reflected from first electrode E1 may have an exit angle, or a fifth angle A5, on the surface of the second electrode E2.

According to some example embodiments, when the incidence angle A0 is 45°, each of the first, second, third, fourth, and fifth angles A1, A2, A3, A4, and A5 may be less than 30°. As discussed above, a reflected light exiting at an angle of 30° may occur visibility errors, such as glare to user's eyes. According to some example embodiments, the reflected lights LR1, LR2, LR3, LR4, and LR5 originating from the incident lights L1, L2, L3, and L4 may be controlled to have reflection angles (or exit angles) different from or less than 30°, and thus the electronic panel EPP may improve in visibility.

Referring to FIG. 6A, the pixel definition layer PDL may have a surface tilted angle that is different based on position. For easiness of description, FIG. 6A shows plots PL-S1 and PL-P1 representing surface tilted angles at distances for examples in which the pixel definition layer PDL has an average thickness of 2.1 μm, plots PL-S2 and PL-P2 representing surface tilted angles at distances for examples in which the pixel definition layer PDL has an average thickness of 2.5 μm, and numbers indicating the surface tilted angles at corresponding positions. Each shape of the plots PL-S1, PL-P1, PL-S2, and PL-P2 may correspond to a surface flexure of the pixel definition layer PDL according to some example embodiments of the present inventive concept.

FIG. 6B shows relationship between surface tilted angles and exit angles. A surface tilted angle greater than 0° means a convex flexure, and a surface tilted angle less than 0° means a concave flexure. Referring to FIG. 6B, it may be found that the surface tilted angle is about 4° when the exit angle is 30°.

Returning to FIG. 6A, as shown by the plots PL-S1 and PL-P1 for the examples in which the pixel definition layer PDL has an average thickness of 2.1 μm, a zone whose surface tilted angle is 4° exists within a distance range between 7 μm and 8 μm, about 7.4 μm on average, away from a distal end (0.0 μm). As shown by the plots PL-S2 and PL-P2 for the examples in which the pixel definition layer PDL has an average thickness of 2.5 μm, a zone whose surface tilted angle is 4° exists within a distance range between 10.5 μm and 12 μm, about 11.1 μm on average, away from the distal end (0.0 μm). The distal end (0.0 μm) may be a portion of the pixel definition layer PDL, which portion corresponds to a side of the opening OP and adjoins the first electrode E1 to form a boundary between the portion and the first electrode E1.

Referring to the plots PL-S1, PL-P1, PL-S2, and PL-P2, it may be found that a zone whose surface tilted angle is 4° exists within a wider distance range on the plots PL-S2 and PL-P2 for the examples in which the pixel definition layer PDL has a relatively large average thickness of 2.5 μm. That is, an increase in thickness of the pixel definition layer PDL may increase a range of the zone whose surface tilted angle is 4° and may also increase a rational portion of reflected light exiting at an angle of 30° relative to light incident at an angle of 45°. Therefore, according to some example embodiments of the present inventive concept, a relative reduction in thickness of the pixel definition layer PDL may decrease a rational portion of reflected light exiting at an angle of 30° and may suppress visibility defects caused by reflection of external light.

Figure 7A:
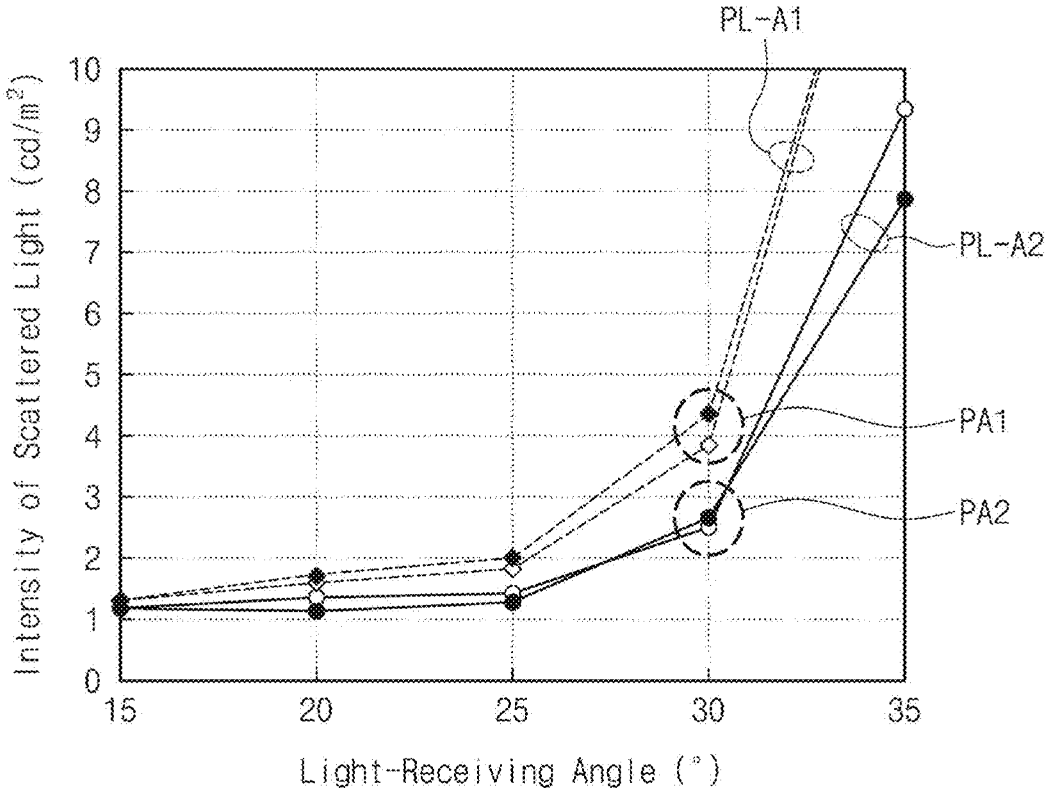
FIGS. 7A to 7C illustrate graphs showing intensity of scattered light versus a light-receiving angle on a pixel definition layer according to some example embodiments of the present inventive concept.
Figure 7B:
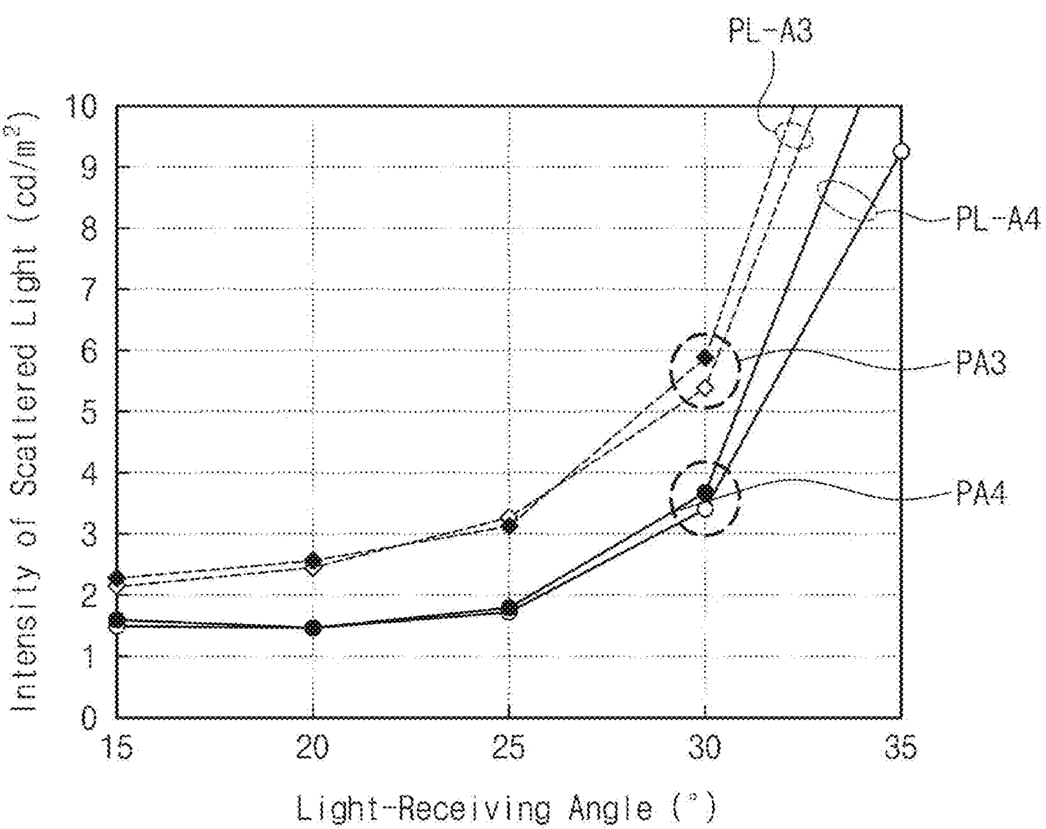
Figure 7C:
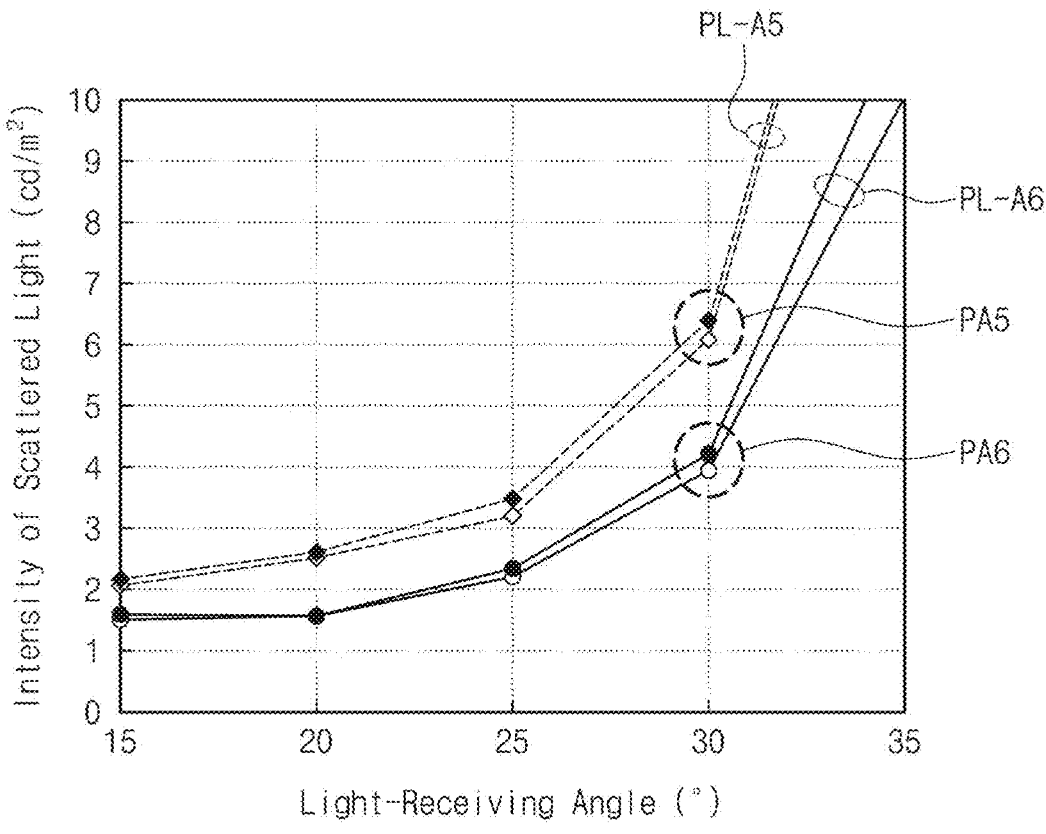

FIGS. 7A to 7C illustrate graphs showing intensity of scattered light versus a light-receiving angle on a pixel definition layer according to some example embodiments of the present inventive concept. A light-receiving angle may substantially correspond to an exit angle of reflected light. FIG. 7A illustrates a graph related to the pixel definition layer whose thickness is 1.2 μm, FIG. 7B illustrates a graph related to the pixel definition layer whose thickness is 1.5 μm, and FIG. 7C illustrates a graph related to the pixel definition layer whose thickness is 1.8 μm. Hereinafter, aspects of some example embodiments of the present inventive concept will be described with reference to FIGS. 7A to 7C.

FIG. 7A illustrates first plots PL-A1 showing intensity of scattered light versus a light-receiving angle for two examples whose pixel azimuthal angle is 0°, and also illustrates second plots PL-A2 showing intensity of scattered light versus a light-receiving angle for two examples whose pixel azimuthal angle is 90°. As illustrated in FIG. 7A, each of the first and second plots PL-A1 and PL-A2 shows tendency that the intensity of scattered light rapidly increases at the light-receiving angle of 30°.

The first plots PL-A1 show that the intensity of scattered light is about 3.8 cd/m$^2$ at a point PA1 where the light-receiving angle is 30°, and that the intensity of scattered light increases with a sharp slope when the light-receiving angle becomes greater than 30°. The second plots PL-A2 show that the intensity of scattered light is about 2.8 cd/m$^2$ at a point PA2 where the light-receiving angle is 30°, and that the intensity of scattered light increases with a sharp slope when the light-receiving angle becomes greater than 30°. It may thus be found that when the light-receiving angle becomes equal to or greater than 30°, the intensity of scattered light increases and light leakage defects readily occur.

FIG. 7B illustrates third plots PL-A3 showing intensity of scattered light versus a light-receiving angle for two examples whose pixel azimuthal angle is 0°, and also illustrates fourth plots PL-A4 showing intensity of scattered light versus a light-receiving angle for two examples whose pixel azimuthal angle is 90°. As illustrated in FIG. 7B, each of the third and fourth plots PL-A3 and PL-A4 shows tendency that the intensity of scattered light sharply increases at the light-receiving angle of 30°.

The third plots PL-A3 show that the intensity of scattered light is about 4.9 cd/m$^2$ at a point PA3 where the light-receiving angle is 30°, and that the intensity of scattered light increases with a sharp slope when the light-receiving angle becomes greater than 30°. The fourth plots PL-A4 show that the intensity of scattered light is about 3.4 cd/m$^2$ at a point PA4 where the light-receiving angle is 30°, and that the intensity of scattered light increases with a sharp slope when the light-receiving angle becomes greater than 30°. It may thus be found that when the light-receiving angle becomes equal to or greater than 30°, the intensity of scattered light increases and light leakage defects readily occur.

FIG. 7C illustrates fifth plots PL-A5 showing intensity of scattered light versus a light-receiving angle for two examples whose pixel azimuthal angle is 0°, and also illustrates sixth plots PL-A6 showing intensity of scattered light versus a light-receiving angle for two examples whose pixel azimuthal angle is 90°. As illustrated in FIG. 7C, each of the fifth and sixth plots PL-A5 and PL-A6 shows tendency that the intensity of scattered light sharply increases at the light-receiving angle of 30°.

The fifth plots PL-A5 show that the intensity of scattered light is about 5.7 cd/m$^2$ at a point PA5 where the light-receiving angle is 30°, and that the intensity of scattered light increases with a sharp slope when the light-receiving angle becomes greater than 30°. The sixth plots PL-A6 show that the intensity of scattered light is about 3.8 cd/m$^2$ at a point PA6 where the light-receiving angle is 30°, and that the intensity of scattered light increases with a sharp slope when the light-receiving angle becomes greater than 30°. It may thus be found that when the light-receiving angle becomes equal to or greater than 30°, the intensity of scattered light increases and light leakage defects readily occur.

Referring to FIGS. 7A to 7C, it may be found that the examples, in which the pixel definition layer PDL has a relatively small thickness of 1.2 μm, have a relatively small intensity of scattered light at the same light-receiving angle of 30°, as shown in FIG. 7A. According to some example embodiments of the present inventive concept, the smaller thickness of the pixel definition layer PDL, the lower intensity of reflected light whose exit angle is 30° that produces visibility errors. Accordingly, the electronic panel EPP may improve in visibility.

Figure 8A:
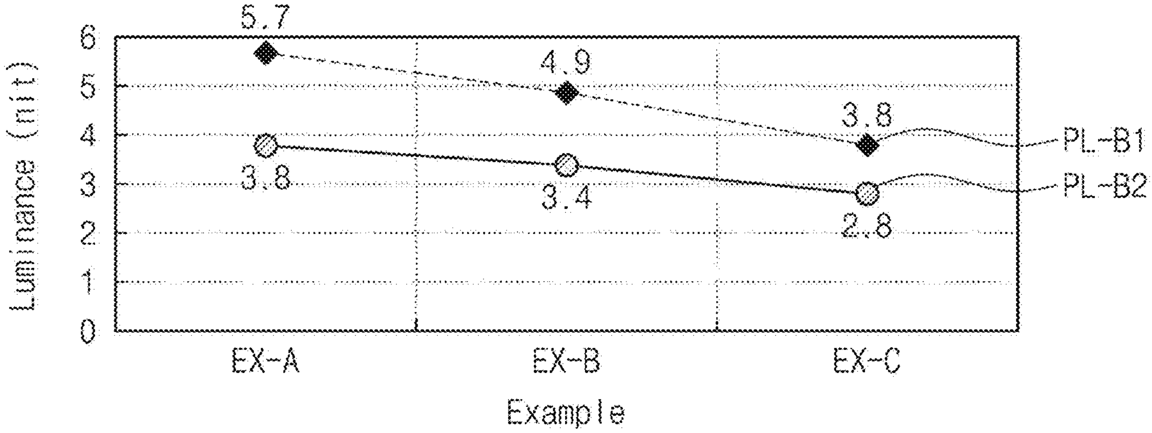
FIGS. 8A and 8B illustrate graphs showing a variation in luminance according to some example embodiments of the present inventive concept.
Figure 8B:
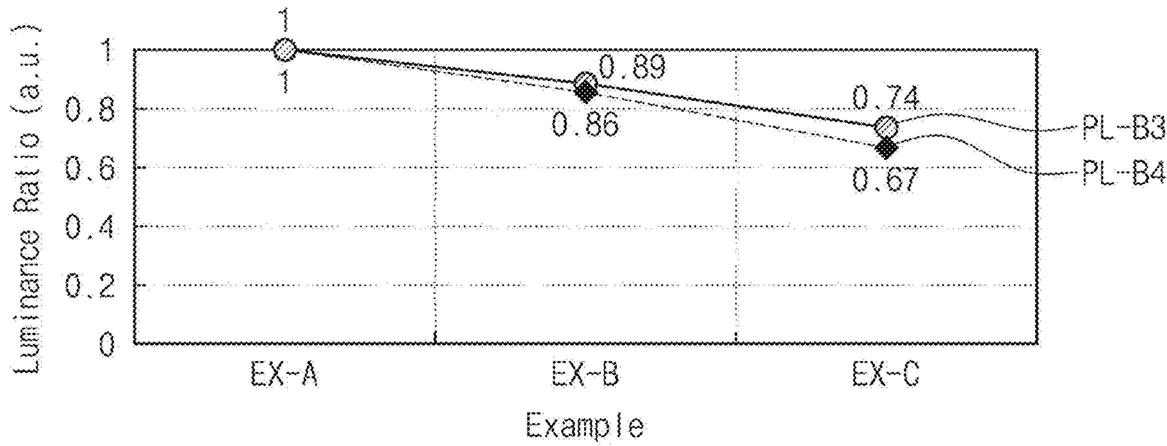

FIGS. 8A and 8B illustrate graphs showing a variation in luminance according to some example embodiments of the present inventive concept. FIG. 8A illustrates luminance of scattered light in each of first, second, and third examples EX-A, EX-B, and EX-C, and FIG. 8B illustrates a luminance ratio of scattered light in each of the first, second, and third examples EX-A, EX-B, and EX-C. The luminance ratio shown in FIG. 8 is obtained when the luminance of the first example EX-A is used as a reference value of 1.

The first, second, and third examples EX-A, EX-B, and EX-C may have different thickness ratios between the pixel definition layer PDL and the spacer SP. According to some example embodiments, the first, second, and third examples EX-A, EX-B, and EX-C may be designed to have the same total thickness (see TT of FIG. 4B) of the pixel definition layer PDL and the spacer SP, but designed to have different first thicknesses (see T1 of FIG. 4B) or second thicknesses (see T2 of FIG. 4B).

For example, the first example EX-A, whose total thickness TT is 3.94 μm, may include the pixel definition layer PDL whose thickness is 1.8 μm and the spacer SP whose thickness is 2.14 μm. In this case, a ratio of the first thickness T1 to the total thickness TT may be 0.54.

The second example EX-B, whose total thickness TT is 3.94 μm, may include the pixel definition layer PDL whose thickness is 1.50 μm and the spacer SP whose thickness is 2.44 μm. In this case, a ratio of the first thickness T1 to the total thickness TT may be 0.62.

The third example EX-C, whose total thickness TT is 3.94 μm, may include the pixel definition layer PDL whose thickness is 1.20 μm and the spacer SP whose thickness is 2.74 μm. In this case, a ratio of the first thickness T1 to the total thickness TT may be 0.70.

Referring to FIGS. 8A and 8B, the intensity of scattered light may become reduced when the thickness of the spacer SP becomes relatively increased and the thickness of the pixel definition layer PDL becomes relatively reduced. For example, the larger ratio of the thickness of the spacer SP to the thickness of the pixel definition layer PDL, the greater reduction in luminance of scattered light.

According to some example embodiments, a first plot PL-B1 shown in FIG. 8A and a second plot PL-B4 shown in FIG. 8B may be associated with examples whose rational portion of the spacer SP is relatively small, compared to a third plot PL-B2 shown in FIG. 8A and a fourth plot PL-B3 shown in FIG. 8B. For example, each of the first and second plots PL-B1 and PL-B4 may relate to examples in which a ratio of a length of the pixel definition layer PDL to a total length of the pixel definition layer PDL and the spacer SP is 0.81, which lengths extend in one direction in a unit zone, and each of the third and fourth plots PL-B2 and PL-B3 may relate to examples in which the length ratio is 0.88. According to some example embodiments, an effect of improvement in luminance may be observed on the third and fourth plots PL-B2 and PL-B3 in which the pixel definition layer PDL has a length whose rational portion is relatively large.

According to some example embodiments, the intensity of scattered light may be reduced when the ratio of the thickness of the spacer SP to the total thickness of the pixel definition layer PDL and the spacer SP is designed equal to or greater than 0.5, or when the thickness of the spacer SP is designed greater than the thickness of the pixel definition layer PDL. Accordingly, the electronic panel EPP may improve in visibility.

Figure 9:
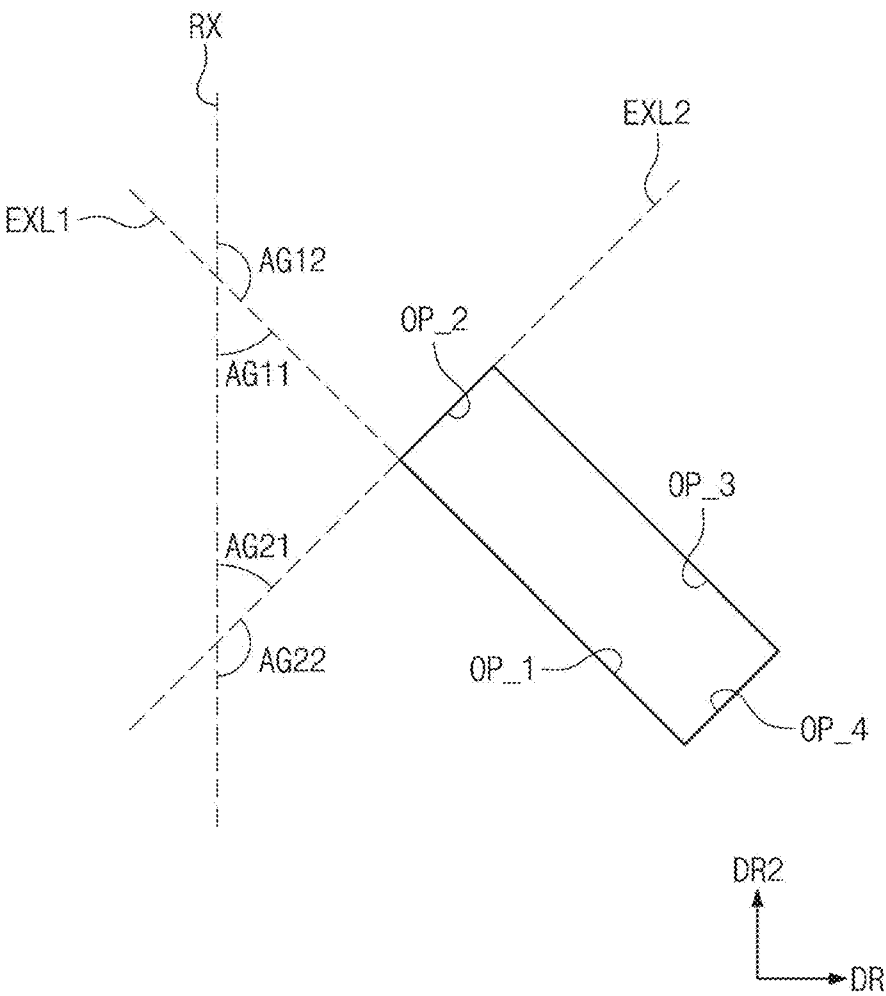
FIG. 9 illustrates a plan view showing a portion of an electronic panel according to some example embodiments of the present inventive concept.

FIG. 9 illustrates a plan view showing a portion of an electronic panel according to some example embodiments of the present inventive concept. FIGS. 10A to 10D illustrate graphs showing luminance of scattered light versus an azimuthal angle of a pixel according to some example embodiments of the present inventive concept. Hereinafter, aspects of some example embodiments of the present inventive concept will be described with reference to FIGS. 9 and 10A to 10D. Those parts substantially the same as those discussed with reference to FIGS. 1 to 8B are allocated the same reference numerals thereto, and repetitive explanations thereof will be omitted.

FIG. 9 shows one opening that defines one emission region. The opening may include first, second, third, and fourth sides OP_1, OP_2, OP_3, and OP_4. According to some example embodiments, the first side OP_1 and the third side OP_3 may be parallel to and opposed to each other. The second side OP_2 and the fourth side OP_4 may be parallel to and opposed to each other.

Each of the first, second, third, and fourth sides OP_1, OP_2, OP_3, and OP_4 may be inclined relative to a reference line RX. The reference line RX may be an imaginary line that extends in a direction parallel to one of the first, second, third, and fourth side surfaces (see S1, S2, S3, and S4 of FIG. 3). The reference line RX may extend in a direction perpendicular to external light that is incident on the electronic panel (see EPP of FIG. 3). According to some example embodiments, the reference line RX is illustrated, as an example, to extend along a direction parallel to the second direction DR2.

An extension line EXL1 of the first side OP_1 may be inclined at a first acute angle AG11 and a first obtuse angle AG12 relative to the reference line RX. In certain embodiments, the first acute angle AG11 may be designed to have a range of 45°±15°, and the first obtuse angle AG12 may be designed to have a range of 135°±15°. For example, the first acute angle AG11 may have a range between 30° and 60°, and the first obtuse angle AG12 may have a range between 120° and 150°.

An extension line EXL2 of the second side OP_2 may be inclined at a second acute angle AG21 and a second obtuse angle AG22 relative to the reference line RX. In certain embodiments, the second acute angle AG21 may be designed to have a range of 45°±15°, and the second obtuse angle AG22 may be designed to have a range of 135°±15°. For example, the second acute angle AG21 may have a range between 30° and 60°, and the second obtuse angle AG22 may have a range between 120° and 150°. According to some example embodiments, a sum of the first acute angle AG11 and the second acute angle AG21 may be 90°.

The third side OP_3 may extend in the same direction as that of the first side OP_1, and may have the first acute angle AG11 and the first obtuse angle AG12 relative to the reference line RX. Similarly, the fourth side OP_4 may extend in the same direction as that of the second side OP_2, and may have the second acute angle AG21 and the second obtuse angle AG22 relative to the reference line RX.

Referring to FIGS. 10A to 10D, it may be ascertained that how luminance of scattered light changes with an azimuthal angle. The azimuthal angle may correspond to the first acute angle AG11, or an angle of the first side OP_1 relative to the reference line RX. For easiness of description, in FIGS. 10A to 10D, circles are drawn to indicate the azimuthal angles of 0°, 45°, 90°, 135°, and 180°.

Figure 10A:
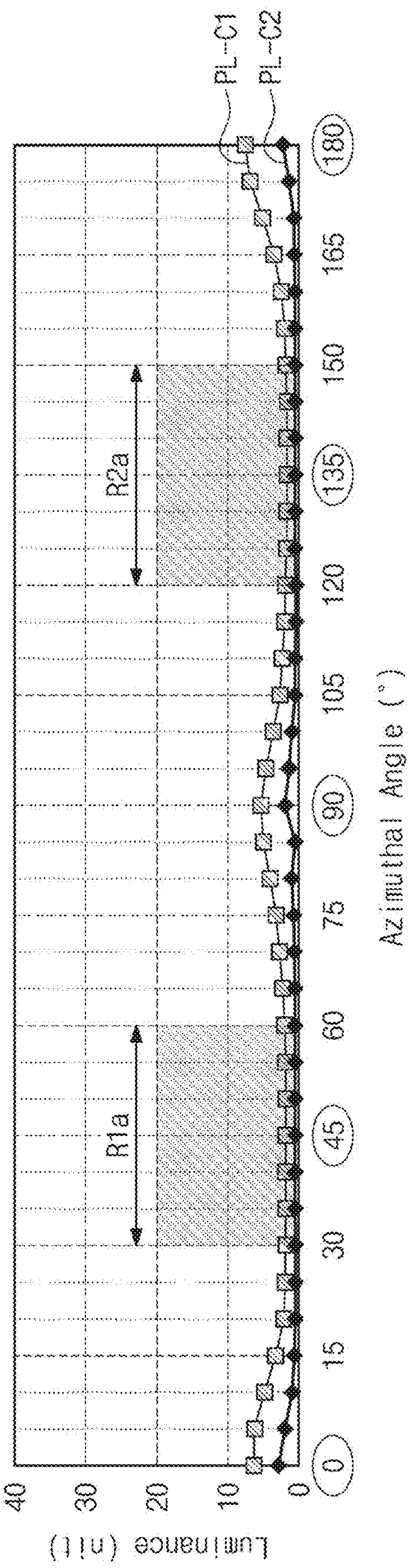
FIGS. 10A to 10D illustrate graphs showing luminance of scattered light versus an azimuthal angle of a pixel according to some example embodiments of the present inventive concept.

In FIG. 10A, a first plot PL-C1 shows luminance of scattered light whose light-receiving angle is 30°, and a second plot PL-C2 shows luminance of scattered light whose light-receiving angle is 15°. Referring to FIG. 10A, the luminance of scattered light is relatively low within a first range R1*a* and a second range R2*a*. For example, within the first range R1*a* and the second range R2*a,* light leakage defects may be suppressed and intensity of reflected light causing glare may be reduced. In this case, the first range R1*a* falls within a range of 45°±15°, and the second range R2*a* falls within a range of 135°±15°.

Figure 10B:
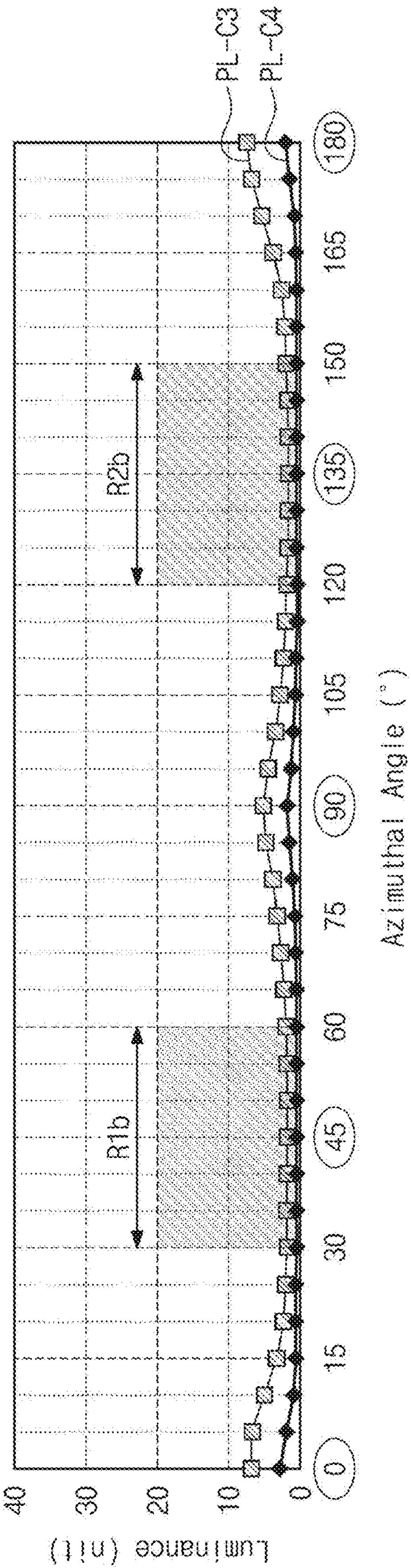

In FIG. 10B, a third plot PL-C3 shows luminance of scattered light whose light-receiving angle is 30°, and a fourth plot PL-C4 shows luminance of scattered light whose light-receiving angle is 15°. Referring to FIG. 10B, the luminance of scattered light is relatively low within a first range R1*b* and a second range R2*b*. For example, within the first range R1*b* and the second range R2*b,* light leakage defects may be suppressed and intensity of reflected light causing glare may be reduced. In this case, the first range R1*b* falls within a range of 45°±15°, and the second range R2*b* falls within a range of 135°±15°.

Figure 10C:
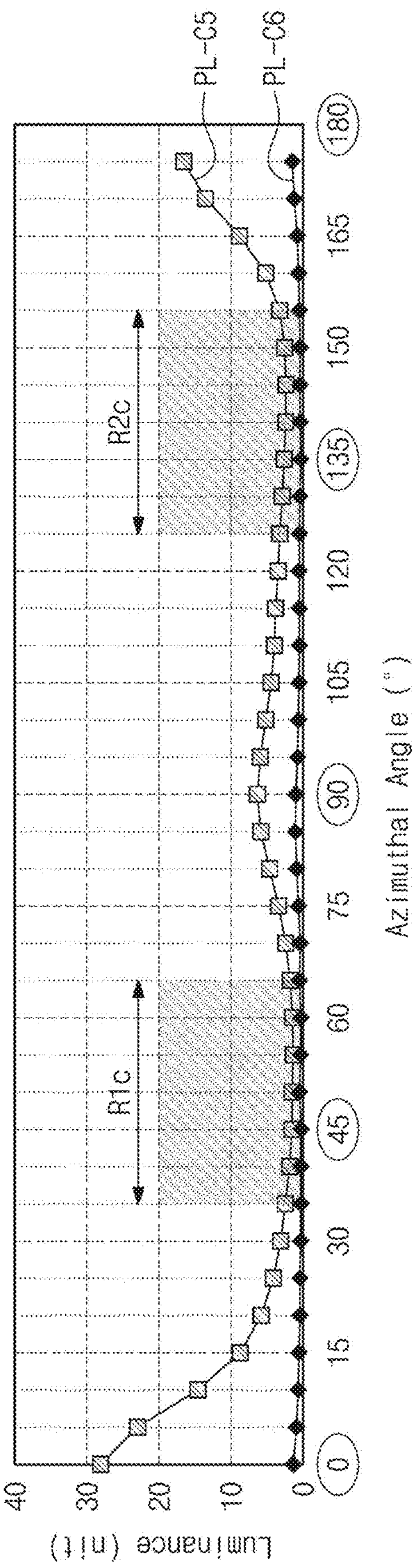

In FIG. 10C, a fifth plot PL-C5 shows luminance of scattered light whose light-receiving angle is 30°, and a sixth plot PL-C6 shows luminance of scattered light whose light-receiving angle is 15°. Referring to FIG. 10C, the fifth plot PL-C5 has relatively high intensity of scattered light at the azimuthal angles of 0°, 90°, and 180°, compared to the first, second, third, and fourth plots PL-C1, PL-C2, PL-C3, and PL-C4.

In addition, the luminance of scattered light is relatively low within a first range R1*c* and a second range R2*c*. For example, within the first range R1*c* and the second range R2*c,* light leakage defects may be suppressed and intensity of reflected light causing glare may be reduced. In this case, the first range R1*c* falls within a range of 45°±15°, and the second range R2*c* falls within a range of 135°±15°.

Figure 10D:
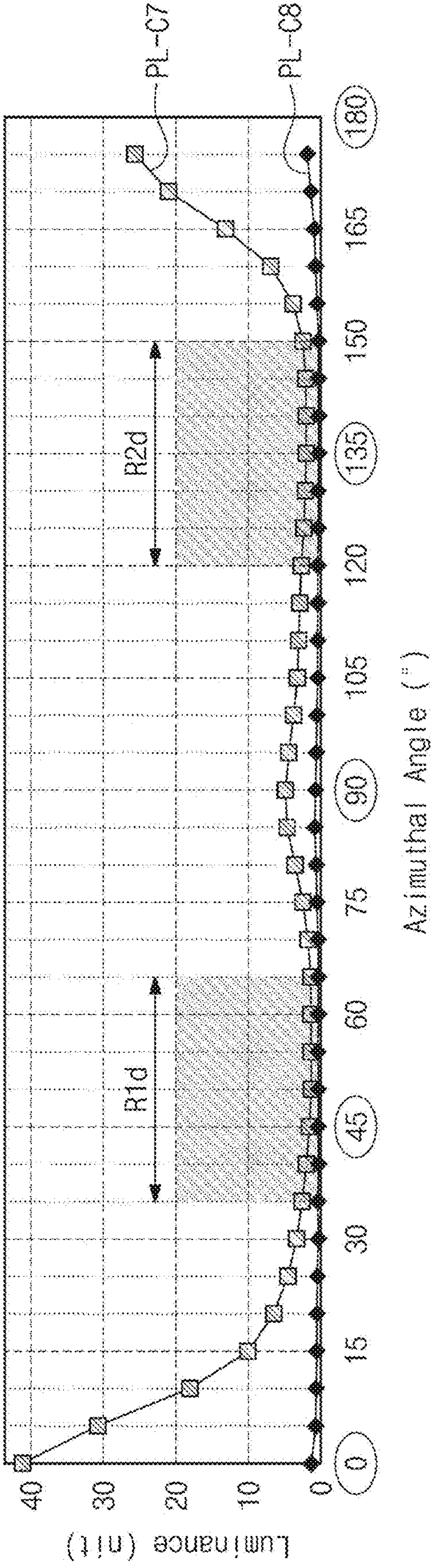

In FIG. 10D, a seventh plot PL-C7 shows luminance of scattered light whose light-receiving angle is 30°, and an eighth plot PL-C8 shows luminance of scattered light whose light-receiving angle is 15°. Referring to FIG. 10D, the seventh plot PL-C7 has relatively high intensity of scattered light at the azimuthal angles of 0°, 90°, and 180°, compared to the first, second, third, and fourth plots PL-C1, PL-C2, PL-C3, and PL-C4.

In addition, the luminance of scattered light is relatively low within a first range R1*d* and a second range R2*d*. For example, within the first range R1*d* and the second range R2*d,* light leakage defects may be suppressed and intensity of reflected light causing glare may be reduced. In this case, the first range R1*d* falls within a range of 45°±15°, and the second range R2*d* falls within a range of 135°±15°.

According to some example embodiments, when the first acute angle AG11 is designed to fall within a range of 45°±15° or 135°±15°, it may be possible to reduce the occurrence of reflected light that is reflected at an exit angle of 30° inducing glare. Therefore, the electronic panel EPP may be provided to have improvement in visibility and display characteristics.

Figure 11A:
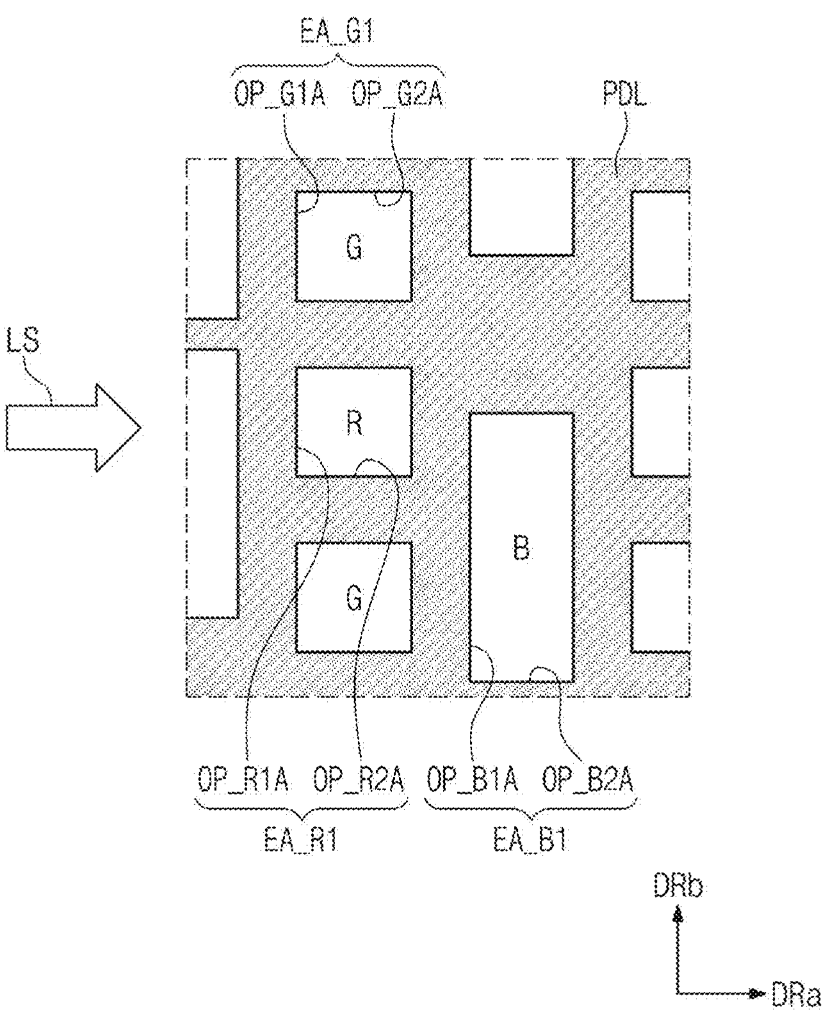
FIG. 11A illustrate a plan view partially showing a comparative example.
Figure 11B:
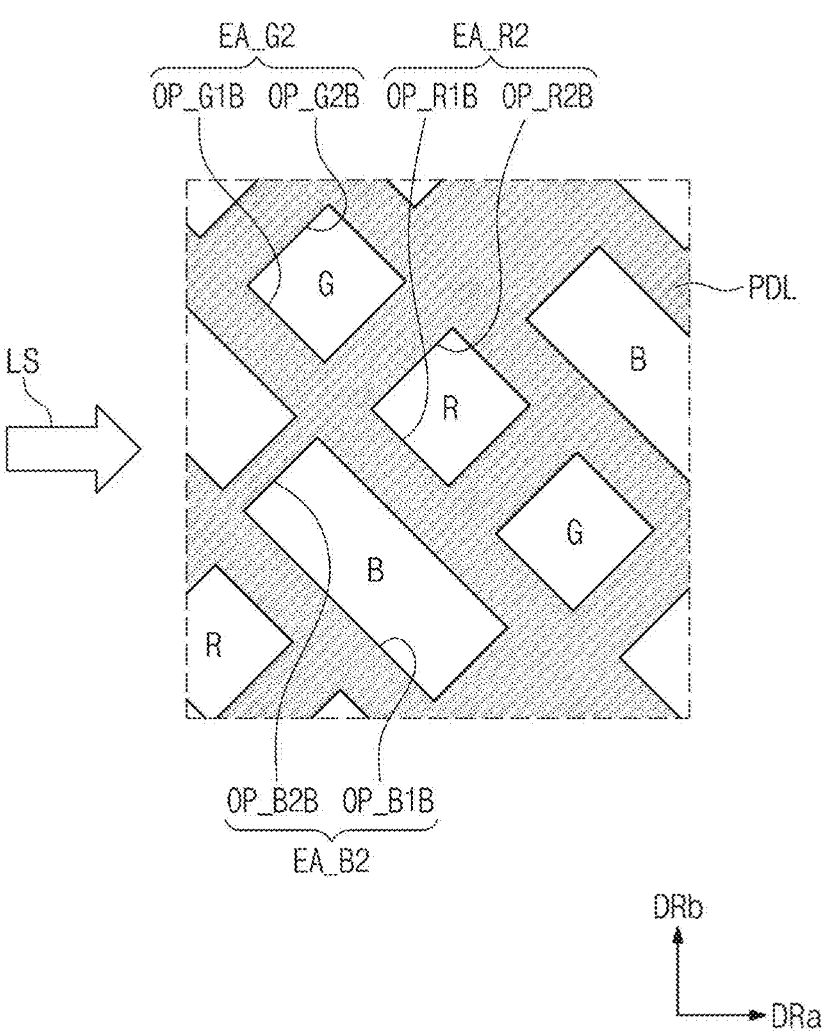
FIG. 11B illustrates a plan view showing a portion of an electronic panel according to some example embodiments of the present inventive concept.
Figure 11C:
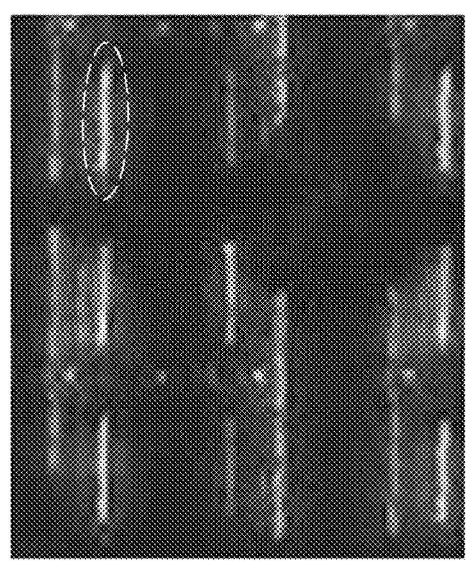
FIG. 11C illustrates an image capturing a comparative example.
Figure 11D:
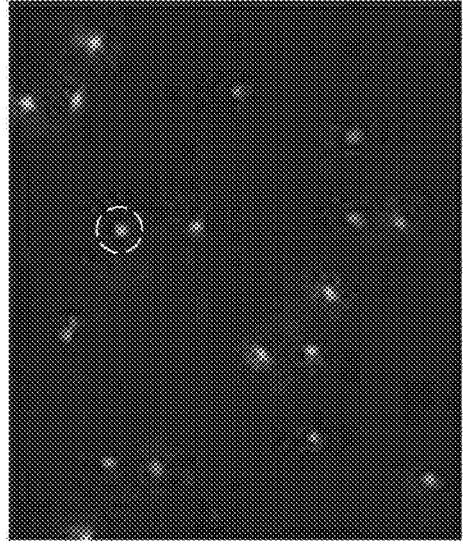
FIG. 11D illustrates an image capturing an electronic panel according to some example embodiments of the present inventive concept.

FIG. 11A illustrate a plan view partially showing a comparative example. FIG. 11B illustrates a plan view showing a portion of an electronic panel according to some example embodiments of the present inventive concept. FIG. 11C illustrates an image capturing a comparative example. FIG. 11D illustrates an image capturing an electronic panel according to some example embodiments of the present inventive concept. FIGS. 11C and 11D show images capturing light leakage defects on the electronic panel shown in FIGS. 11A and 11B, respectively. Hereinafter, aspects of some example embodiments of the present inventive concept will be described with reference to FIGS. 11A to 11D. Those parts substantially the same as those discussed with reference to FIGS. 1 to 10D are allocated the same reference numerals thereto, and some repetitive explanations thereof will be omitted.

Referring to FIG. 11A, each of emission regions EA_R1, EA_G1, and EA_B1 may have sides inclined at an angle of 0° or 90° relative to a reference line.

For example, first sides OP_R1A, OP_G1A, and OP_B1A may extend at an angle of 0° relative to a perpendicular direction (referred to hereinafter as a reference line direction DRb) to an incident direction DRa of the external light LS. For example, the first sides OP_R1A, OP_G1A, and OP_B1A may extend along a direction parallel to the reference line direction DRb and may be parallel to the reference line direction DRb. in addition, second sides OP_R2A, OP_G2A, and OP_B2A may extend at an angle of 90° relative to the reference line direction DRb.

In contrast, referring to FIG. 11B, each of emission regions EA_R2, EA_G2, EA_B2 according to some example embodiments of the present inventive concept may have sides inclined at angles relative to the reference line direction DRb. The inclined angles may satisfy a range of 45°±15° or 135°±15°.

For example, first sides OP_R1B, OP_G1B, and OP_B1B may be inclined at an angle of 45°±15° relative to the reference line direction DRb of the external light LS. In addition, second sides OP_R2B, OP_G2B, and OP_B2B may extend at an angle of 135°±15° relative to the reference line direction DRb.

Referring to FIG. 11C, among reflected lights originating from the external light LS, lights reflected at an exit angle of 30° are shown by a plurality of straight lines. As illustrated in FIG. 11C, the reflected lights may be substantially recognized as light leakage defects. In FIG. 11C, a dotted line is drawn to indicate scattered light occurring from one of the first sides OP_R1A, OP_G1A, and OP_B1A illustrated in FIG. 11A.

In contrast, referring to FIG. 11D, among reflected lights originating from the external light LS, lights reflected at an exit angle of 30° are shown by a plurality of dots. Light leakage defects shown in FIG. 11D are relatively less recognized in comparison with FIG. 11C. In FIG. 11D, a dotted line is drawn to indicate scattered light occurring from one of vertices of the emission regions EA_R2, EA_G2, and EA_B2 illustrated in FIG. 11B.

According to some example embodiments, the electronic panel (see EPP of FIG. 3) may include first sides OP_R1B, OP_G1B, and OP_B1B inclined at an angle of 45°±15° or second sides OP_R2B, OP_G2B, and OP_B2B inclined at an angle of 135°±15°, which may result in a reduction in the occurrence of light leakage defects on the emission regions EA_R2, EA_G2, and EA_B2. Accordingly, the electronic panel EPP may improve in visibility.

Figure 12A:
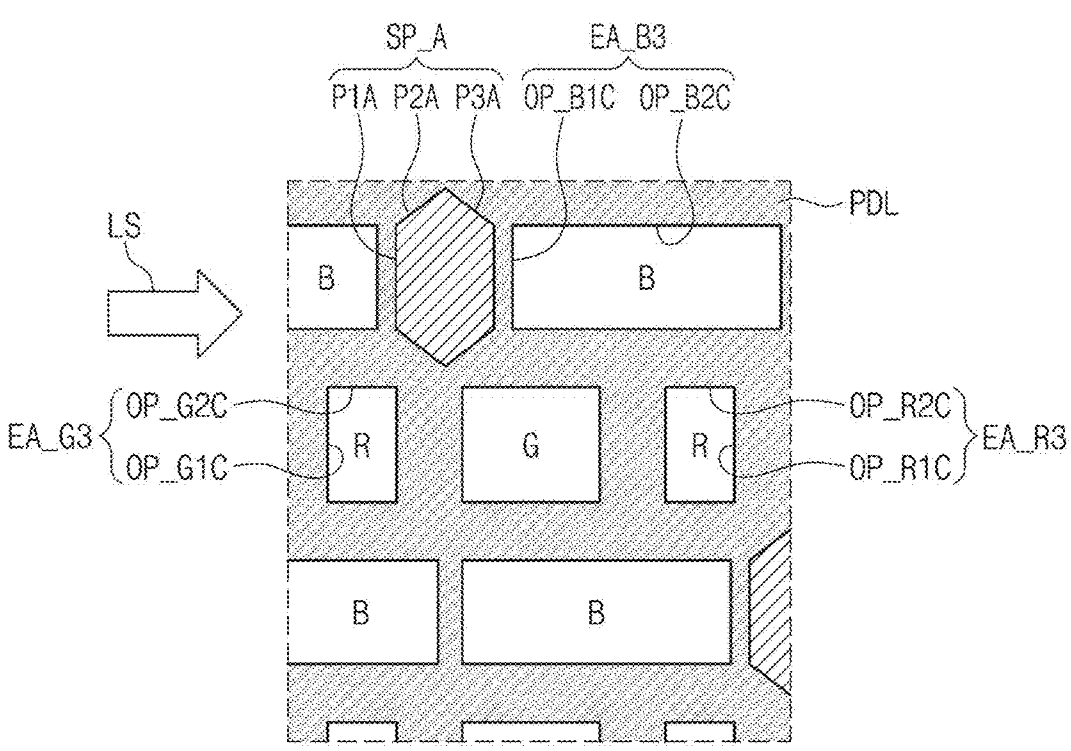
FIG. 12A illustrate a plan view partially showing a comparative example.
Figure 12A:
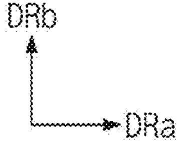
Figure 12B:
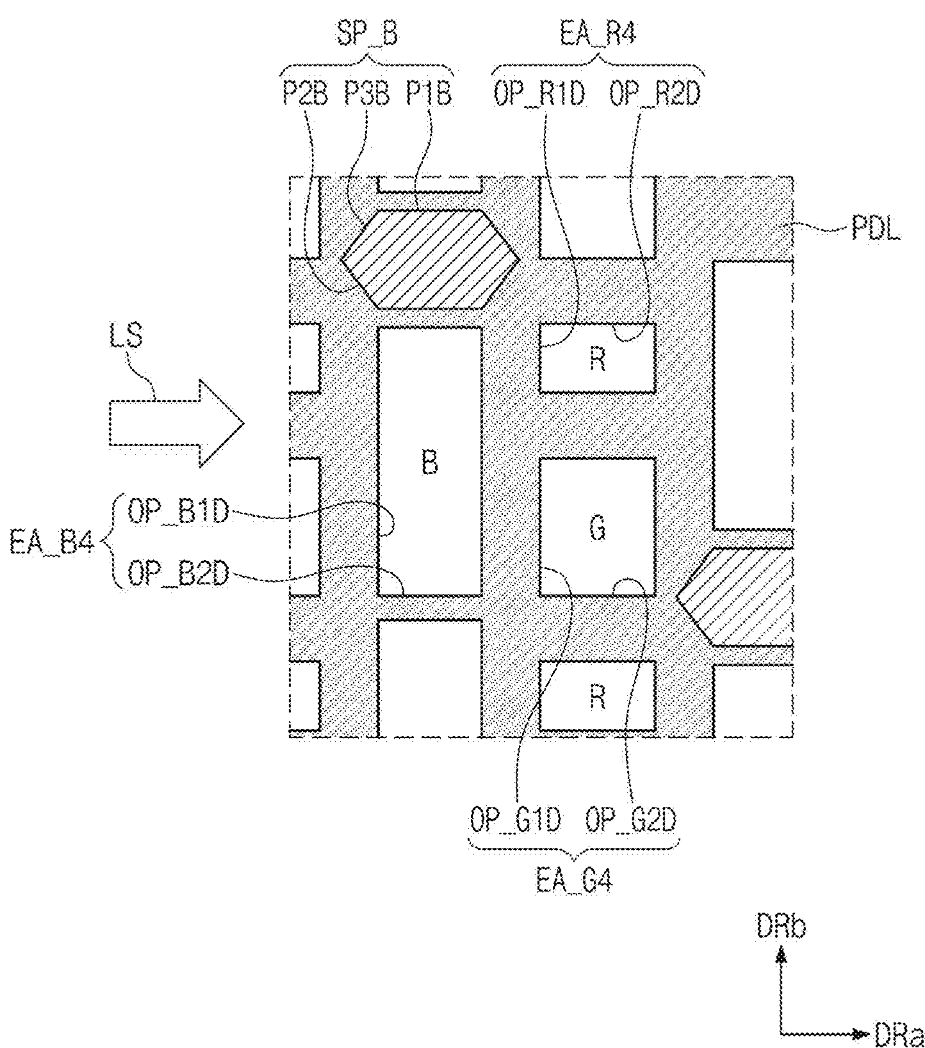
FIG. 12B illustrates a plan view partially showing an electronic panel according to some example embodiments of the present inventive concept.
Figure 12C:
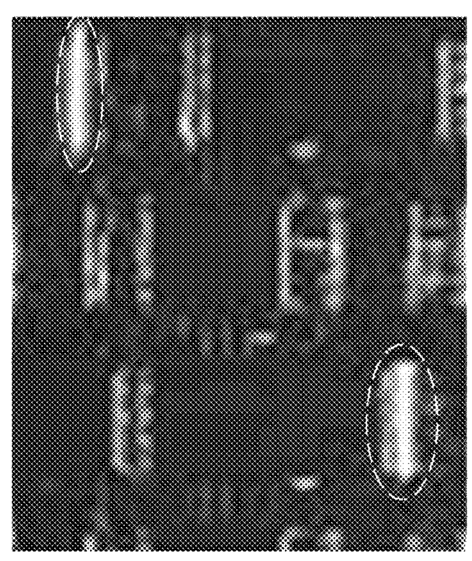
FIG. 12C illustrates an image capturing a comparative example.
Figure 12D:
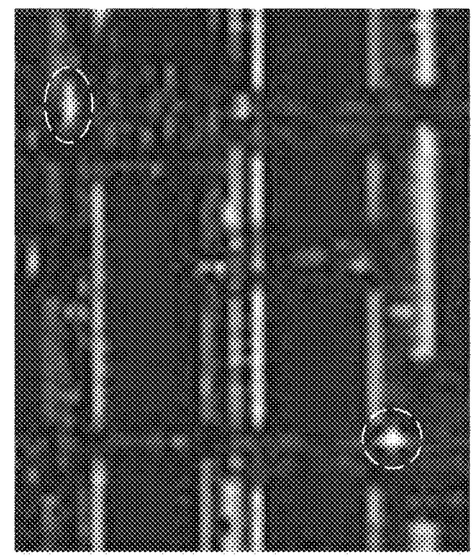
FIG. 12D illustrates an image capturing an electronic panel according to some example embodiments of the present inventive concept.

FIG. 12A illustrate a plan view partially showing a comparative example. FIG. 12B illustrates a plan view showing a portion of an electronic panel according to some example embodiments of the present inventive concept. FIG. 12C illustrates an image capturing a comparative example. FIG. 12D illustrates an image capturing an electronic panel according to some example embodiments of the present inventive concept. FIGS. 12C and 12D show images capturing light leakage defects on the electronic panel shown in FIGS. 12A and 12B, respectively. Hereinafter, aspects of some example embodiments of the present inventive concept will be described with reference to FIGS. 12A to 12D. Those parts substantially the same as those discussed with reference to FIGS. 1 to 11D are allocated the same reference numerals thereto, and repetitive explanations thereof will be omitted.

Referring to FIG. 12A, a comparative example includes emission regions EA_R3, EA_G3, and EA_B3 and a spacer SP_A. The emission regions EA_R3, EA_G3, and EA_B3 may include first sides OP_R1C, OP_G1C, and OP_B1C that extend at angle of 0° relative to the reference line direction DRb, and also include second sides OP_R2C, OP_G2C, and OP_B2C that extend at angle of 90° relative to the reference line direction DRb. The spacer SP_A may include a first sidewall P1A extending at angle of 0° relative to the reference line direction DRb, a second sidewall P2A inclined to the reference line direction DRb, and a third sidewall P3A.

The second sidewall P2A may be inclined at an angle of 135°±15° relative to the reference line direction DRb. The third sidewall P3A may be inclined at an angle of 45°±15° relative to the reference line direction DRb.

Referring to FIG. 12B, the electronic panel (see EPP of FIG. 3) according to some example embodiments of the present inventive concept includes emission regions EA_R4, EA_G4, and EA_B4 and a spacer SP_B. The emission regions EA_R4, EA_G4, and EA_B4 may include first sides OP_R1D, OP_G1D, and OP_B1D that extend at angle of 0° relative to the reference line direction DRb, and also include second sides OP_R2D, OP_G2D, and OP_B2D that extend at angle of 90° relative to the reference line direction DRb. The spacer SP_B may include a first sidewall P1B extending at angle of 90° relative to the reference line direction DRb, a second sidewall P2B inclined to the reference line direction DRb, and a third sidewall P3B.

The second sidewall P2B may be inclined at an angle of 45°±15° relative to the reference line direction DRb. The third sidewall P3B may be inclined at an angle of 135°±15° relative to the reference line direction DRb.

Referring to FIG. 12C, light leakage defects may be found which are produced by the first sidewall P1A of the spacer SP_A according to the comparative example. The first sidewall P1A extends along a direction substantially perpendicular to the external light LS. Because intensity of scattered light is high at the first sidewall P1A inclined at an angle of 0° relative to the reference line direction DRb, light leakage defects may prominently occur.

In contrast, referring to FIG. 12D, it may be found that light leakage defects occurring at one or more of vertices of the spacer SP_B according to some example embodiments of the present inventive concept are relatively less than light leakage defects shown in FIG. 12C. For example, among dotted circles, a circle placed on a relatively left side indicates scattered light occurring at a vertex between the second and third sidewalls P2B and P3B of the spacer SP_B, which vertex or location of the spacer SP_B is a position that is first in contact with the external light LS.

According to some example embodiments, when the sidewalls P2B and P3B of the spacer SP_B which first receive the external light LS are designed inclined to the reference line direction DRb, it may be possible to reduce light leakage defects caused by the spacer SP_B. In this case, the sidewalls P2B and P3B of the spacer SP_B may be designed to have an inclined angle of 45°±15° or 135°±15° relative to the reference line direction DRb. Accordingly, the electronic panel EPP may be provided to have improved visibility.

Figure 13A:
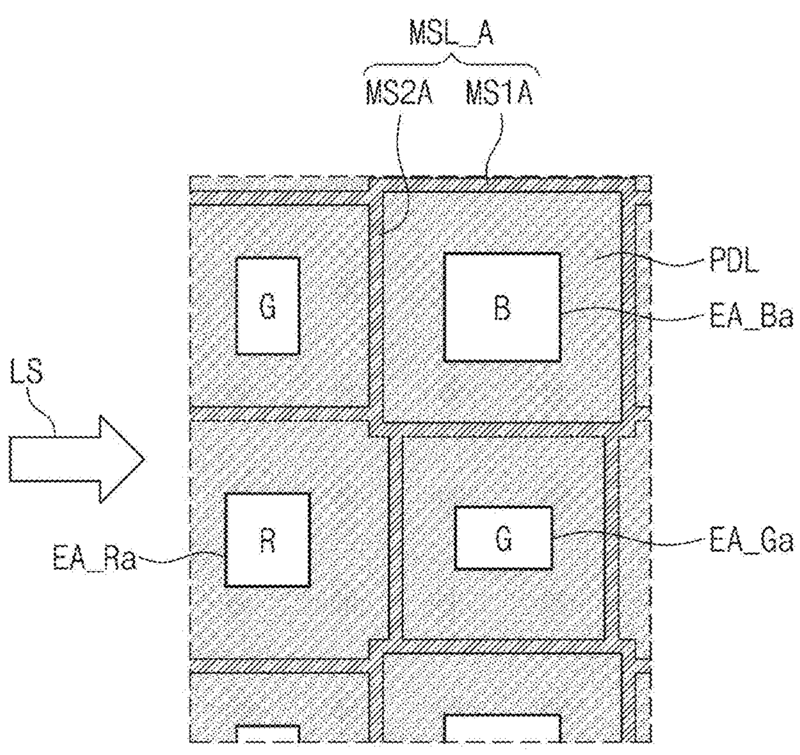
FIG. 13A illustrate a plan view partially showing a comparative example.
Figure 13A:
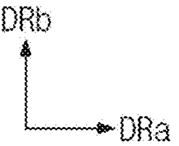
Figure 13B:
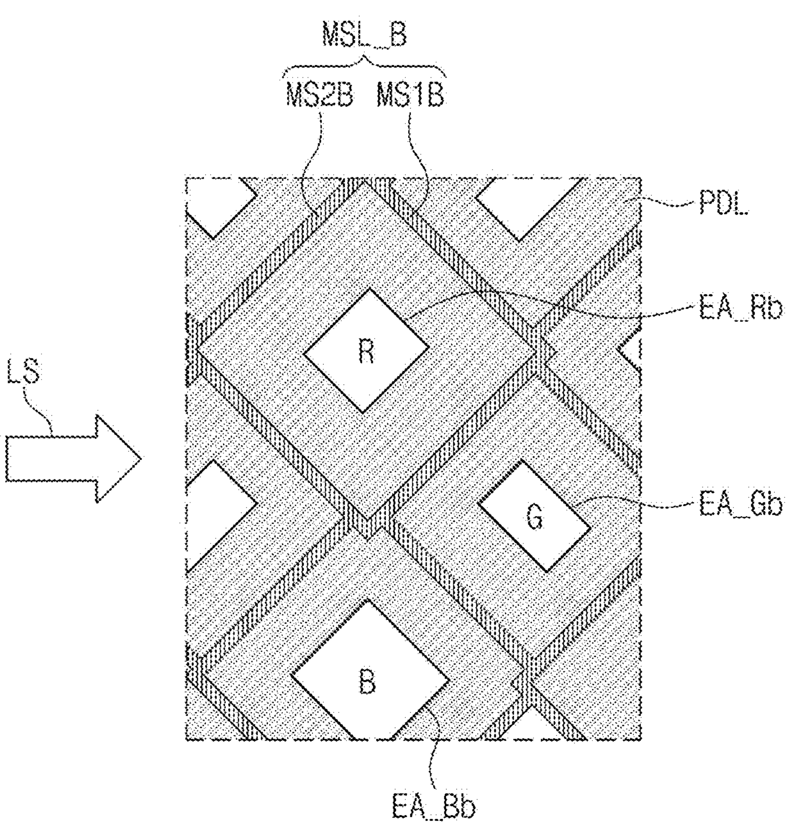
FIG. 13B illustrates a plan view partially showing an electronic panel according to some example embodiments of the present inventive concept.
Figure 13B:
Figure 13C:
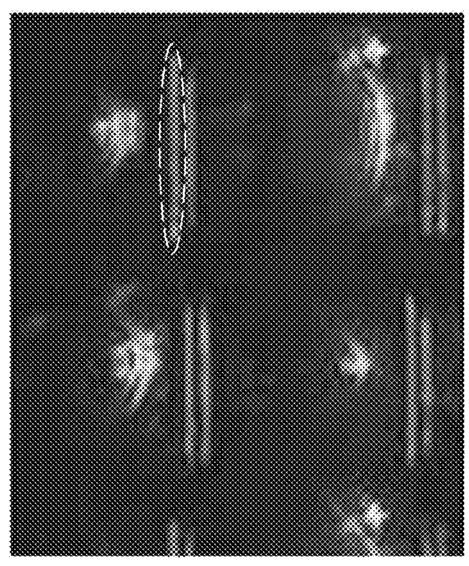
FIG. 13C illustrates an image capturing a comparative example.
Figure 13D:
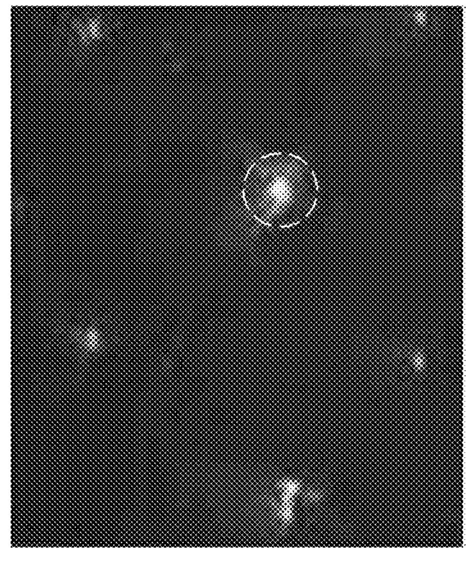
FIG. 13D illustrates an image capturing an electronic panel according to some example embodiments of the present inventive concept.

FIG. 13A illustrate a plan view partially showing a comparative example. FIG. 13B illustrates a plan view partially showing an electronic panel according to some example embodiments of the present inventive concept. FIG. 13C illustrates an image capturing a comparative example. FIG. 13D illustrates an image capturing an electronic panel according to some example embodiments of the present inventive concept. FIGS. 13C and 13D illustrate images capturing light leakage defects on the electronic panels shown in FIGS. 13A and 13B, respectively. Hereinafter, aspects of some example embodiments of the present inventive concept will be described with reference to FIGS. 13A to 13D. Those parts substantially the same as those discussed with reference to FIGS. 1 to 12D are allocated the same reference numerals thereto, and repetitive explanations thereof will be omitted.

Referring to FIG. 13A, a comparative example includes emission regions EA_Ra, EA_Ga, and EA_Ba and also includes mesh lines MSL_A. The mesh lines MSL_A are positioned on the pixel definition layer PDL. According to some example embodiments, a certain dielectric layer may be located between the emitting element (see, e.g., EE of FIG. 4B) and the mesh lines MSL_A. Thus, electric connection may be prevented between the emitting element EE and the mesh lines MSL_A.

The mesh lines MSL_A may be a sensor that detects external pressure. The external pressure may mean pressure caused by user's hand, conductor, heat, light, or the like, and further include contact, approach, pressure, or the like with respect to the display surface (see FS of FIG. 1).

The mesh lines MSL_A may include a first mesh line MS1A and a second mesh line MS2A. Each of the first and second mesh lines MS1A and MS2A may be formed of a conductive material. The first mesh line MS1A and the second mesh line MS2A may be connected to define openings. The openings may overlap corresponding emission regions EA_Ra, EA_Ga, and EA_Ba.

The first mesh line MS1A extends along the incident direction DRa of the external light LS, and the second mesh line MS2A extends along the reference line direction DRb. The first mesh line MS1A may be inclined at an angle of 90° relative to the reference line direction DRb, and the second mesh line MS2A may extend at an angle of 0° relative to the reference line direction DRb.

Referring to FIG. 13B, the electronic panel (see EPP of FIG. 3) according to some example embodiments of the present inventive concept includes emission regions EA_Rb, EA_Gb, and EA_Bb and also includes mesh lines MSL_B. The emission regions EA_Rb, EA_Gb, and EA_Bb include their sides inclined to the reference line direction DRb. The sides of the emission regions EA_Rb, EA_Gb, and EA_Bb may extend in a direction corresponding to the sides shown in FIG. 11B. A repetitive description will be omitted below.

The mesh lines MSL_B are located on the pixel definition layer PDL. The mesh lines MSL_B include a first mesh line MS1B and a second mesh line MS2B. The first mesh line MS1B and the second mesh line MS2B are connected to define openings. The openings expose corresponding emission regions EA_Rb, EA_Gb, and EA_Bb.

Each of the first mesh line MS1B and the second mesh lines MS2B may be inclined to the reference line direction DRb. The first mesh line MS1B and the second mesh line MS2B may be inclined at an angle of 45°±15° or 135°±15° relative to the reference line direction DRb. For example, the first mesh line MS1B may be inclined at an angle of 45°±15° relative to the reference line direction DRb. The second mesh line MS2B may be inclined at an angle of 135°±15° relative to the reference line direction DRb.

Referring to FIG. 13C, a dotted line may represent a light leakage defect caused by the second mesh line MS2A among the mesh lines MSL_A according to the comparative example. Because the second mesh line MS2A extends along a direction perpendicular to the external light LS, the second mesh line MS2A causes high intensity of scattered light. Accordingly, the mesh lines MSL_A may remarkably produce light leakage defects.

In contrast, referring to FIG. 13D, a dotted line may represent a light leakage defect occurring at a vertex of the mesh line MSL_B according to some example embodiments of the present inventive concept. For example, the vertex may correspond to a point where the first mesh line MS1B meets the second mesh line MS2B. In comparison with FIG. 13C, it may be found that light leakage defects are relatively reduced.

According to some example embodiments, the first and second mesh lines MS1B and MS2B constituting the mesh lines MSL_B may be designed inclined to the reference line direction DRb, which may result in a reduction in light leakage defects caused by the mesh lines MSL_B. In this case, the first and second mesh lines MS1B and MS2B may be designed to have an inclined angle of 45°±15° or 135°±15° relative to the reference line direction DRb. Accordingly, the electronic panel EPP may be provided to have improved visibility.

Figure 14A:
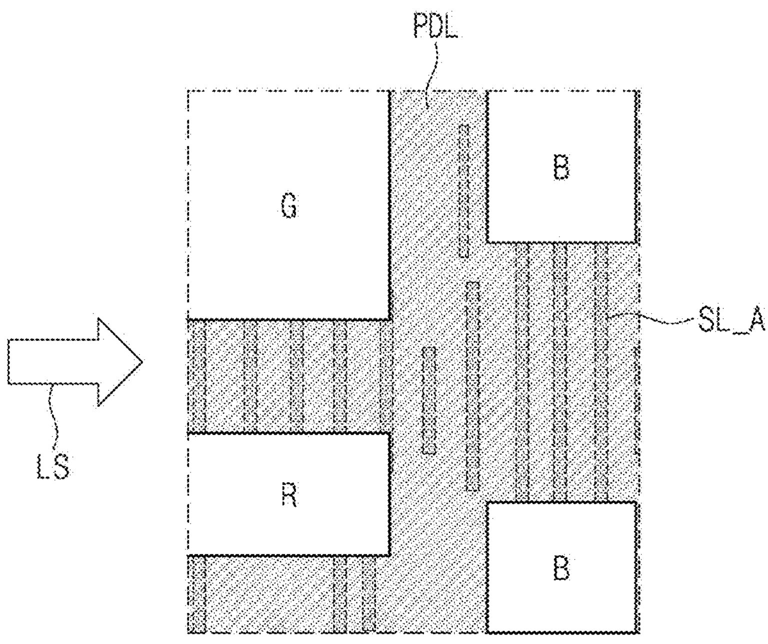
FIG. 14A illustrate a plan view partially showing a comparative example.
Figure 14A:
Figure 14B:
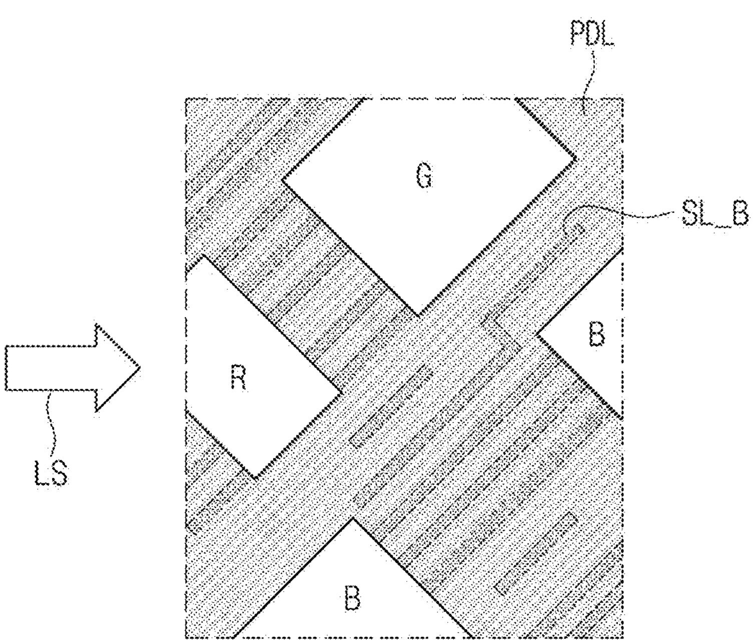
FIG. 14B illustrates a plan view partially showing an electronic panel according to some example embodiments of the present inventive concept.
Figure 14B:
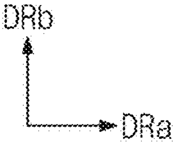
Figure 14C:
FIG. 14C illustrates an image capturing a comparative example.
Figure 14D:
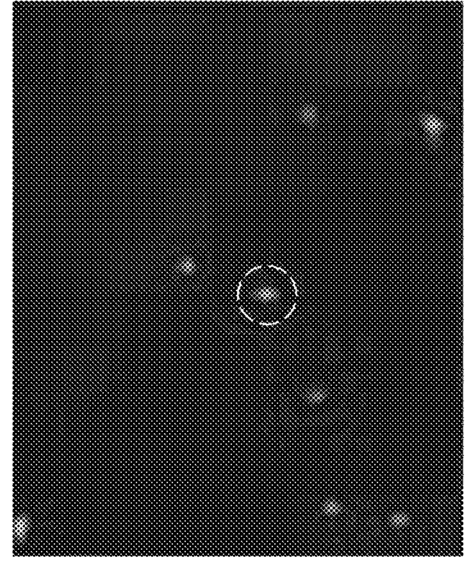
FIG. 14D illustrates an image capturing an electronic panel according to some example embodiments of the present inventive concept.

FIG. 14A illustrate a plan view partially showing a comparative example. FIG. 14B illustrates a plan view partially showing an electronic panel according to some example embodiments of the present inventive concept. FIG. 14C illustrates an image capturing a comparative example. FIG. 14D illustrates an image capturing an electronic panel according to some example embodiments of the present inventive concept. FIGS. 14C and 14D illustrate images capturing light leakage defects on the electronic panels shown in FIGS. 14A and 14B, respectively. Hereinafter, aspects of some example embodiments of the present inventive concept will be described with reference to FIGS. 14A to 14D. Those parts substantially the same as those discussed with reference to FIGS. 1 to 13D are allocated the same reference numerals thereto, and some repetitive explanations thereof will be omitted.

In FIGS. 14A and 14B, dotted lines are drawn to indicate signal lines SL_A and SL_B. As discussed above, the signal lines SL_A and SL_B may be positioned below the pixel definition layer PDL. As shown in FIG. 14A, the signal lines SL_A according to a comparative example may extend along a direction parallel to the reference line direction DRb. An inclined angle of 0° may be made between the reference line direction DRb and the signal lines SL_A according to the comparative example.

In contrast, as shown in FIG. 14B, the signal lines SL_B according to some example embodiments of the present inventive concept may extend along a direction inclined to the reference line direction DRb. The signal lines SL_B according to some example embodiments of the present inventive concept may be inclined at an angle of 45°±15° or 135°±15° relative to the reference line direction DRb. According to some example embodiments, the signal lines SL_B are illustrated to have an inclined angle of 135°±15° relative to the reference line direction DRb.

Referring to FIG. 14C, a dotted line may represent a light leakage defect caused by a part of the signal lines SL_A according to the comparative example. Because the signal line SL_A according to the comparative example extends along a direction perpendicular to the external light LS, intensity of scattered light is high at the signal lines SL_A. Accordingly, the signal lines SL_A may remarkably produce light leakage defects.

In contrast, referring to FIG. 14D, a dotted line may represent a light leakage defect occurring at one end of the signal line SL_B according to some example embodiments of the present inventive concept. In comparison with FIG. 14C, it may be found that light leakage defects are relatively reduced at the electronic panel (see EPP of FIG. 3) according to some example embodiments of the present inventive concept.

According to some example embodiments, when the signal lines SL_B are designed to extend inclined to the reference line direction DRb, it may be possible to reduce light leakage defects caused by the signal lines SL_B. In this case, the signal lines SL_B may be designed to have an inclined angle of 45°±15° or 135°±15° relative to the reference line direction DRb. Accordingly, the electronic panel EPP may be provided to have improved visibility.

According to some example embodiments, visibility of an electronic panel may be improved due to a reduction in the occurrence of reflected light that produces defects, such as glare caused by external light. In addition, the visibility of the electronic panel may also be improved due to a reduction in the occurrence of internal light leakage defects. Furthermore, the electronic panel with improved visibility may provide an electronic apparatus that is easily manipulated by users.

Although aspects of some example embodiments have been described with reference to a number of illustrative examples thereof, it will be understood by those of ordinary skill in the art that various changes in form and details may be made without departing from the spirit and scope of the present inventive concept as set forth in the following claims and their equivalents.

Thus, the technical scope of the present inventive concept is not limited by the embodiments and examples described above, but by the following claims and their equivalents.

What is claimed is:

1. An electronic apparatus, comprising:

an electronic panel including a plurality of emission regions; and a housing unit accommodating the electronic panel, wherein the electronic panel includes:

a base substrate including a front surface, a rear surface opposed to the front surface, and first to fourth side surfaces connecting the front surface and the rear surface to each other;

a pixel definition layer on the front surface and having a plurality of openings defined therein, the openings corresponding to the emission regions and including a first side and a second side connected to each other;

a plurality of emitting elements in the openings;

a plurality of thin film transistors between the base substrate and the pixel definition layer, the thin film transistors being connected to corresponding emitting elements; and a plurality of signal lines between the pixel definition layer and the base substrate, the signal lines being connected to corresponding thin film transistors, wherein the first side, the second side, and at least one of the signal lines located between adjacent ones of the emission regions extend in a direction parallel to a plane of the front surface and at an inclined angle relative to an extension direction of the first side surface, when viewed from the front surface in a plan view, wherein a smallest value of the inclined angle is in a range of 45°±15°, a spacer on the pixel definition layer and spaced apart from the openings;

wherein, when viewed from the front surface, the spacer includes:

a first sidewall having a first inclined angle relative to the first side surface; and a second sidewall having a second inclined angle relative to the first side surface, the second sidewall being connected to the first sidewall.

2. The electronic apparatus of claim 1, wherein each of the emitting elements includes:

a first electrode;

a second electrode on the first electrode and covering the pixel definition layer; and an emitting pattern between the first electrode and the second electrode, wherein the first side and the second side are portions of the pixel definition layer that are in contact with the first electrode.

3. The electronic apparatus of claim 1, wherein the spacer is covered with the second electrode.

4. The electronic apparatus of claim 1, wherein a thickness of the spacer is equal to or greater than a thickness of the pixel definition layer on an area where the spacer is located.

5. The electronic apparatus of claim 4, wherein the spacer and the pixel definition layer have a unitary shape.

6. The electronic apparatus of claim 4, wherein a ratio of the thickness of the pixel definition layer to a sum of thicknesses of the pixel definition layer and the spacer is equal to or less than 0.3.

7. The electronic apparatus of claim 1, wherein each of the first inclined angle and the second inclined angle has a range of 45°±15°.

8. The electronic apparatus of claim 7, wherein the first sidewall and the second sidewall of the spacer face the first side surface among the first side surface and the second side surface opposed to the first side surface.

9. The electronic apparatus of claim 1, further comprising a plurality of mesh lines that lie on the pixel definition layer and have a plurality of mesh openings defined therein, the mesh openings corresponding to the emission regions, wherein, when viewed from the front surface, an extending direction of each of the mesh lines is inclined at a certain angle relative to the first side surface, wherein a smallest value of the certain angle is in a range of 45°±15°.

10. The electronic apparatus of claim 1, wherein the housing unit is an automotive vehicle.

* * * * *